United States Patent
Shramkova et al.

(10) Patent No.: US 11,972,508 B2
(45) Date of Patent: Apr. 30, 2024

(54) IMAGE SENSOR COMPRISING A COLOR SPLITTER WITH TWO DIFFERENT REFRACTIVE INDEXES, AND DIFFERENT HEIGHT

(71) Applicant: InterDigital CE Patent Holdings, Paris (FR)

(72) Inventors: Oksana Shramkova, Cesson-Sévigné (FR); Mitra Damghanian, Cesson-Sévigné (FR); Laurent Blonde, Thorigné-Fouillard (FR)

(73) Assignee: InterDigital CE Patent Holdings, SAS, Paris (FR)

( * ) Notice: Subject to any disclaimer, the term of this patent is extended or adjusted under 35 U.S.C. 154(b) by 449 days.

(21) Appl. No.: 17/257,248

(22) PCT Filed: May 28, 2019

(86) PCT No.: PCT/EP2019/063739
§ 371 (c)(1),
(2) Date: Dec. 30, 2020

(87) PCT Pub. No.: WO2020/007534
PCT Pub. Date: Jan. 9, 2020

(65) Prior Publication Data
US 2021/0233291 A1    Jul. 29, 2021

(30) Foreign Application Priority Data

Jul. 2, 2018    (EP) ..................................... 18305846

(51) Int. Cl.
*G06T 11/00*    (2006.01)
*G02B 27/10*    (2006.01)
(Continued)

(52) U.S. Cl.
CPC ........ *G06T 11/001* (2013.01); *G02B 27/1006* (2013.01); *G06T 11/005* (2013.01);
(Continued)

(58) Field of Classification Search
CPC ...... G06T 11/001; G06T 11/005; G06T 11/40; H01L 27/14621; H01L 27/14625; G02B 27/1006
See application file for complete search history.

(56) References Cited

U.S. PATENT DOCUMENTS 3,718,383 A    2/1973 Moore
6,099,146 A    8/2000 Imamura
(Continued)

FOREIGN PATENT DOCUMENTS

CN    1606704 A    4/2005
CN    1661478 A    8/2005
(Continued)

OTHER PUBLICATIONS

Gennarelli, G.et al., "A uniform asymptotic solution for the diffraction by a right-angled dielectric wedge" IEEE transactions on antennas and propagation, vol. 59 No. 3, Mar. 2011 pp. 898-903 (6 pages).

(Continued)

*Primary Examiner* — Antoinette T Spinks
(74) *Attorney, Agent, or Firm* — Jeffery J. Brosemer

(57) ABSTRACT

It is proposed an image sensor comprising pixels for acquiring color information from incoming visible light, wherein said image sensor comprising three pixels being partially covered by a color splitter structure for deviating only one color channel of said incoming visible light towards one of said three pixels, and for deviating other colors of said incoming visible light towards the other pixels among said three pixels. The color splitter structure comprises a first (Continued)

Incident electromagnetic wave (101), a second (103) and a third (102) parallelepiped structures arranged so that the first and the third parallelepiped structures are side by side and in contact with the second parallelepiped structure, and wherein the first and the third parallelepiped structures have same dimensions, and are made of a same dielectric material, with a refractive index $n_H$, and wherein said second parallelepiped structure being smaller in height (H2) compared to said first and third parallelepiped structures (H1), and wherein said second parallelepip ed structure being made of a dielectric material with a refractive index n L, and wherein the refractive index n H is greater than the refractive index n L.

20 Claims, 20 Drawing Sheets

(51) Int. Cl.
  *G06T 11/40* (2006.01)
  *H01L 27/146* (2006.01)
(52) U.S. Cl.
  CPC ........ *G06T 11/40* (2013.01); *H01L 27/14621* (2013.01); *H01L 27/14625* (2013.01)

(56) References Cited

U.S. PATENT DOCUMENTS

| | | | |
|---|---|---|---|
| 7,394,535 | B1 | 7/2008 | Chen |
| 8,885,997 | B2 | 11/2014 | Nguyen |
| 9,099,370 | B2 | 8/2015 | Nishiwaki |
| 9,140,602 | B2 | 9/2015 | Narasimhan |
| 9,297,939 | B2 | 3/2016 | Palanchoke et al. |
| 9,383,582 | B2 | 7/2016 | Tang |
| 9,419,036 | B2 | 8/2016 | Saitou |
| 9,564,469 | B2 | 2/2017 | Kim |
| 9,766,467 | B2 | 9/2017 | Sohn |
| 9,827,209 | B2 | 11/2017 | Kostamo |
| 9,891,436 | B2 | 2/2018 | Wall |
| 10,534,115 | B1 | 1/2020 | Calafiore |
| 10,866,360 | B2 | 12/2020 | Khorasaninejad |
| 11,163,175 | B2 | 11/2021 | Blondéet al. |
| 11,204,452 | B2 | 12/2021 | Paniagua Dominguez |
| 11,275,252 | B2 | 3/2022 | Boriskin |
| 11,396,474 | B2 | 7/2022 | Drazic |
| 11,573,356 | B2* | 2/2023 | Shramkova ........ G02B 27/4233 |
| 11,604,363 | B2* | 3/2023 | Damghanian ..... H01L 27/14625 |
| 2005/0002611 | A1 | 1/2005 | Levola |
| 2006/0124833 | A1 | 6/2006 | Toda |
| 2009/0190094 | A1 | 7/2009 | Watanabe |
| 2010/0188537 | A1* | 7/2010 | Hiramoto .......... H01L 27/14625 |
| | | | 348/294 |
| 2011/0235166 | A1 | 9/2011 | Zhu |
| 2013/0099343 | A1 | 4/2013 | Toshikiyo |
| 2013/0099434 | A1 | 4/2013 | Yano et al. |
| 2013/0250421 | A1 | 9/2013 | Wakabayashi |
| 2013/0322810 | A1 | 12/2013 | Robbins |
| 2014/0192409 | A1 | 7/2014 | Yamaguchi |
| 2015/0063753 | A1 | 3/2015 | Evans |
| 2015/0221693 | A1 | 8/2015 | Saitou |
| 2015/0286060 | A1 | 10/2015 | Roh |
| 2015/0301333 | A1 | 10/2015 | Levesque |
| 2015/0323800 | A1 | 11/2015 | Nam |
| 2015/0362641 | A1 | 12/2015 | Boyraz |
| 2015/0362841 | A1 | 12/2015 | Zelsacher et al. |
| 2016/0054172 | A1* | 2/2016 | Roh .................. H01L 27/14629 |
| | | | 250/208.2 |
| 2016/0064172 | A1 | 3/2016 | Kirbawy |
| 2016/0064448 | A1* | 3/2016 | Shin .................. H01L 27/14625 |
| | | | 257/292 |
| 2016/0070062 | A1 | 3/2016 | Lipson |
| 2016/0172390 | A1* | 6/2016 | Numata .............. H01L 27/1463 |
| | | | 257/432 |
| 2016/0231568 | A1 | 8/2016 | Saarikko |
| 2017/0006278 | A1 | 1/2017 | Vandame |
| 2017/0012078 | A1 | 1/2017 | Han |
| 2017/0090206 | A1 | 3/2017 | Kim |
| 2017/0092668 | A1 | 3/2017 | Kim |
| 2017/0092676 | A1* | 3/2017 | Yun ................... H01L 27/14627 |
| 2017/0097510 | A1 | 4/2017 | Sohn |
| 2017/0098672 | A1* | 4/2017 | Yun ................... H01L 27/14621 |
| 2017/0179178 | A1* | 6/2017 | Park .................. H01L 31/02162 |
| 2017/0201658 | A1 | 7/2017 | Rosenblatt et al. |
| 2017/0212348 | A1 | 7/2017 | Fu |
| 2017/0307886 | A1 | 10/2017 | Stenberg |
| 2017/0315346 | A1 | 11/2017 | Tervo |
| 2018/0113313 | A1 | 4/2018 | Tekolste |
| 2018/0210147 | A1 | 7/2018 | Khorasaninejad et al. |
| 2018/0231771 | A1 | 8/2018 | Schuck, III |
| 2018/0354844 | A1 | 12/2018 | Drazic |
| 2019/0101700 | A1 | 4/2019 | Boriskin |
| 2019/0121239 | A1 | 4/2019 | Singh |
| 2019/0257986 | A1 | 8/2019 | Paniagua et al. |
| 2020/0233223 | A1 | 7/2020 | Shramkova et al. |
| 2020/0348526 | A1 | 11/2020 | Boriskin |
| 2021/0041609 | A1 | 2/2021 | Shramkova |
| 2021/0041709 | A1 | 2/2021 | Damghanian |
| 2021/0233291 | A1 | 7/2021 | Shramkova et al. |
| 2022/0059250 | A1 | 2/2022 | Shramkova |

FOREIGN PATENT DOCUMENTS

| | | |
|---|---|---|
| CN | 101799589 B | 5/2013 |
| CN | 106331445 A | 1/2017 |
| CN | 106772734 A | 5/2017 |
| CN | 106932845 A | 7/2017 |
| CN | 109073885 A | 12/2018 |
| EP | 1406098 A1 | 4/2004 |
| EP | 1542043 A1 | 6/2005 |
| EP | 2196729 | 6/2010 |
| EP | 2229938 A1 | 9/2010 |
| EP | 2955753 | 12/2015 |
| EP | 3223062 A1 | 9/2017 |
| EP | 3223063 A1 | 9/2017 |
| EP | 3240046 A1 | 11/2017 |
| EP | 3312646 A1 | 4/2018 |
| EP | 3312660 A1 | 4/2018 |
| EP | 3312674 A1 | 4/2018 |
| EP | 3339938 A1 | 6/2018 |
| EP | 3385219 A1 | 10/2018 |
| EP | 3499278 | 6/2019 |
| EP | 3540479 A1 | 9/2019 |
| EP | 3540499 A1 | 9/2019 |
| EP | 3588150 | 1/2020 |
| EP | 3591700 A1 | 1/2020 |
| EP | 3671293 | 6/2020 |
| EP | 3671322 A1 | 6/2020 |
| GB | 2529003 | 2/2016 |
| JP | 2003005129 A | 1/2003 |
| JP | 2014134564 A | 7/2014 |
| JP | 2016500160 A | 1/2016 |
| JP | 2017063198 A | 3/2017 |
| WO | 03007032 A1 | 1/2003 |
| WO | 2003025635 A1 | 3/2003 |
| WO | 2007031991 A2 | 3/2007 |
| WO | 2009083977 A2 | 7/2009 |
| WO | 2014036537 A1 | 3/2014 |
| WO | 2014044912 | 3/2014 |
| WO | 2017116637 | 7/2017 |
| WO | 2017116637 A1 | 7/2017 |
| WO | 2017131983 | 8/2017 |
| WO | 2017162880 A1 | 9/2017 |
| WO | 2017162882 A1 | 9/2017 |
| WO | WO2017162880 A1 | 9/2017 |
| WO | 2017180403 | 10/2017 |
| WO | 2017180403 A1 | 10/2017 |
| WO | WO2018052750 A1 | 3/2018 |
| WO | 2018102582 | 6/2018 |
| WO | 2018102582 A1 | 6/2018 |
| WO | 2018102834 A2 | 6/2018 |

(56) References Cited

FOREIGN PATENT DOCUMENTS

| WO | WO2019175062 A1 | 9/2019 |
|---|---|---|
| WO | WO2020128030 A1 | 6/2020 |
| WO | 2021053182 | 3/2021 |

OTHER PUBLICATIONS

Wang, P. et al., "Ultra-high-sensitivity color imaging via a transparent diffractive-filter array and computational optics: supplementary material." Optica, Oct. 2015 (9 pages).
Fontaine, R. "The state-of-the-art of mainstream CMOS image sensors." In Proceedings of the International Image Sensors Workshop, 2015 (4 pages).
Wang, P. et al., "Computational single-shot hyper-spectral imaging based on a microstructured diffractive optic." In 2016 Conference on Lasers and Electro-Optics (CLEO), IEEE, 2016 (2 pages).
Palanchoke, U. et al., "Spectral sorting of visible light using dielectric gratings." Optics Express 25, No. 26, Dec. 2017 pp. 33389-33399 (11 pages).
Rakovich, Y. P. et al., "Photonic Nanojets in Coupled Microcavities." In the European Conference on Lasers and Electro-Optics, p. JSV2_3. Optical Society of America, 2009 (1 page).
Yang, J. et al., "Polychromatic see-through near-eye display design with two waveguides and a large field-of-view." In Optics, Photonics and Digital Technologies for Imaging Applications IV, vol. 9896, p. 989605. International Society for Optics and Photonics, 2016 (7 pages).
International Preliminary Report on Patentability for PCT/EP2019/084526 dated Jun. 16, 2021, 11 pages.
Liu, Cheng-Yang, "Photonic Jets Produced by Dielectric Micro Cuboids". Applied Optics, vol. 54, Issue 29, (2015), pp. 8694-8699.
Varghese, B. et al., "Influence of an edge height on the diffracted EM field distribution." In 2019 21st International Conference on Transparent Optical Networks (ICTON), pp. 1-4. IEEE, 2019.
Shramkova, O. et al "Photonic nanojet generated by dielectric multi-material microstructure" META Jul. 2019, (2 pages).
International Preliminary Report on Patentability for PCT/EP2019/063802 dated Dec. 29, 2020, 8 pages.
Genevet, Patrice, et. al., "Recent Advances in Planar Optics: From Plasmonic to Dielectric Metasurfaces". Optica, vol. 4, No. 1, Jan. 2017, pp. 139-152.
Aieta, Francesco, et. al., "Multiwavelength Achromatic Metasurfaces by Dispersive Phase Compensation". Sciencexpress, 2015, (8 pages).
Khorasaninejad, Mohammadreza, et. al., "Achromatic Metasurface Lens at Telecommunication Wavelengths". Nano Letters, 2015, (5 pages).
Deng, Zi-Lan, et. al., "Wide-Angle and High-Efficiency Achromatic Metasurfaces for Visible Light". Optical Express, vol. 24, No. 20 pp. 23118-23128 (12 pages).
Avayu, Ori, et. al., "Composite Functional Metasurfaces for Multispectral Achromatic Optics". Nature Communications, 2017, pp. 1-7 (7 pages).
Nishiwaki, Seiji, et. al., "Efficient Colour Splitters for High-Pixel-Density Image Sensors". Nature Photonics, vol. 7, Mar. 2013, pp. 240-246.
International Search Report and Written Opinion of the International Searching Authority for PCT/EP2019/085489, dated Jan. 30, 2020, 11 pages.
Yi, Jianjia, et. al., "Coherent Beam Control With an All-Dielectric Transformation Optics Based Lens". Scientific Reports, vol. 6, No. 1, Jan. 5, 2016, pp. 1-8.
Zhao, Yanhui, et. al., "Beam Bending Via Plasmonic Lenses". Optics Express, vol. 18, No. 22, Oct. 25, 2010, pp. 23458-23465.
Jun, Young Chul, et. al., "Optical Manipulation With Plasmonic Beam Shaping Antenna Structures". Advances in OptoElectronicsm, (2012).
Khorasaninejad, Mohammadreza, et. al., "Super-Dispersive Off-Axis Meta-Lenses for Compact High Resolution Spectroscopy". Nano Letters, vol. 16, No. 6, (2016), pp. 3732-3737.

Liu, Zhaowei, et. al., "Tuning the Focus of a Plasmonic Lens by the Incident Angle". Applied Physics Letters, vol. 88, No. 17, (2006), pp. 171108-1-171108-2.
Chen, Yiguo, et. al., "Engineering the Phase Front of Light With Phase-Change Material Based Planar Lenses". Scientific Reports vol. 5, No. 1, Mar. 2, 2015, pp. 1-7.
Kong, Soon-Cheol, et. al., "Photonic Nanojet-Enabled Optical Data Storage". Optical Society of America, Optics Express, vol. 16, No. 18, Sep. 1, 2008, pp. 13713-13719.
Pacheco-Peña, V., et. al., "Terajets Produced by Dielectric Cuboids". Applied Physics Letters 105, 084102, (2014), doi: 10.1063/1.4894243, 5 pages.
Pacheco-Peña, V., et. al., "Multifrequency Focusing and Wide Angular Scanning of Terajets". Optical Society of America, Optics Letters, vol. 40, No. 2, (2015), 5 pages.
Itagi, A. V., et. al., , "Optics of Photonic Nanojets". Optical Society of America. J. Opt. Soc. Am. A , Vo.22, Dec. 2005 pp. 2847-2858 (12 pages).
Heifetz, Alexander, et. al., "Subdiffraction Optical Resolution of a Gold Nanosphere Located Within the Nanojet pf a Mie-Resonant Dielectric Microsphere". Optical Express, vol. 15, No. 25, (2007), 17334 -17342.
Devilez, Alexis, et. al., "Three-Dimensional Subwavelength Confinement of Light With Dielectric Microspheres". Optics Express, vol. 17, No. 4, Feb. 16, 2009, pp. 2089-2094.
Shen, Yuecheng, et. al., "Ultralong Photonic Nanojet Formed by a Two-Layer Dielectric Microsphere". Optical Letters, Optical Society of America, vol. 39, No. 14, Jul. 15, 2014, 4120-4123.
Ruiz, César Méndez, et. al., "Detection of Embedded Ultrasubwavelength-Thin Dielectric Features Using Elongated Photonic Nanojets". Optical Express, vol. 18, No. 16, Aug. 2, 2010, pp. 16805-16812.
Geints, Yuri E., et. al., "Photonic Nanojet Calculations in Layered Radially Inhomogeneous Micrometer-Sized Spherical Particles". Optical Society of America, vol. 28, No. 8, Aug. 2011, 1825-1830.
Gu, Guoqiang, et. al. "Super-Long Photonic Nanojet Generated from Liquid-Filled Hollow Microcylinder". Optical Society of America, Optical Letters, vol. 40, No. 4, Feb. 15, 2015, pp. 625-628.
Mao, Xiurun, et. al., "Tunable Photonic Nanojet Formed by Generalized Luneburg Lens". Optics Express, vol. 23, No. 20, (2015), pp. 26426-26433.
Geints, Yu, E., et. al., "Modeling Spatially Localized Photonic Nanojets From Phase Diffraction Gratings". Journal of Applied Physics, vol. 119, No. 15, Apr. 21, 2016, pp. 153101-1-153101-6.
International Search Report and Written Opinion of the International Searching Authority for PCT/EP2019/055679 dated May 16, 2019, 10 pages.
International Preliminary Report on Patentability for PCT/EP19/055679 dated Sep. 15, 2020, 6 pages.
Kotlyar, Victor, et. al., "Photonic Nanojets Generated Using Square-Profile Microsteps". Optical Society of America, Applied Optics, vol. 53, No. 24, Aug. 20, 2014, pp. 5322-5329.
International Search Report and Written Opinion of the International Searching Authority for PCT/EP2019/055905 dated May 22, 2019, 12 pages.
International Preliminary Report on Patentability for PCT/EP2019/055905 dated Sep. 15, 2020, 8 pages.
Xiao, Jiasheng, et. al., "Design of Achromatic Surface Microstructure for Near-Eye Display With Diffractive Waveguide". Optics Communications, vol. 452, (2019), pp. 411-416.
International Search Report and Written Opinion of the International Searching Authority for PCT/EP2019/063802 dated Sep. 16, 2019, 14 pages.
Ang, Angeleene S., et. al., "'Photonic Hook' Based Optomechanical Nanoparticle Manipulator". Scientific Reports, vol. 8. No. 2029, Published online: Feb. 1, 2018, pp. 1-7.
Chaumet, P. C., et. al., "Time-Averaged Total Force on a Dipolar Sphere in an Electromagnetic Field". Optics Letters, vol. 25, No. 15, (2000), pp. 1065-1067 (3 pages).
Xu, Chen, et. al., "Photon Nanojet Lens: Design, Fabrication and Characterization". Nanotechnology, vol. 27, No. 16, Mar. 4, 2016, pp. 1-6.

(56) References Cited

OTHER PUBLICATIONS

Yue, Liyang, et. al., "Photonic Hook: A New Curved Light Beam". Optics Letters, vol. 43, No. 4, Feb. 2018, pp. 771-774 (5 pages).
International Search Report and Written Opinion of the International Searching Authority PCT/EP2019/084526 dated Mar. 10, 2020, 15 pages.
Boriskin, Artem, et. al., "Near Field Focusing by Edge Diffraction". Optics Letters, vol. 43, No. 16, Aug. 2018, pp. 4053-4056 (4 pages).
Shramkova, Oksana, et. al., "Localized Photonic Jets Generated by Step-Like Dielectric Microstructures". IEEE 20th International Conference on Transparent Optical Networks (ICTON), (2018), pp. 1-4. (4 pages).
Liu, Cheng-Yang, et. al., "Localized Photonic Nanojets Formed by Core-Shell Diffraction Gratings". Integrated Optics: Physics and Simulations III, International Society for Optics and Photonics, vol. 10242, (2017), p. 102420W (4 pages).
International Search Report and Written Opinion of the International Searching Authority for PCT/EP2019/063739 dated Aug. 8, 2019, (11 pages).
International Preliminary Report on Patentability for PCT/EP2019/063739 dated Jan. 5, 2021, (7 pages).
International Search Report and Written Opinion of the International Searching Authority for PCT/EP2019/086776 dated Mar. 6, 2020, 13 pages.
International Search Report and Written Opinion for PCT/EP2021/057273 dated Jun. 30, 2021 (15 pages).
International Preliminary Report on Patentability for PCT/EP2019/085489 dated Jun. 16, 2021, (8 pages).
International Preliminary Report on Patentability for PCT/EP2019/086776 dated Jun. 16, 2021, (9 pages).
Teranishi, N. et al.,"Evolution of optical structure in image sensors." In 2012 International Electron Devices Meeting, pp. 24-1. IEEE, 2012 (4 pages).
Nishiwaki, S. et al., "Highly Sensitive Image Sensors Using Micro Color Splitters." ITE Technical Report vol. 37 No. 47, Dec. 2014 (2 pages).
Chen, Q. et al., "Nanophotonic image sensors." Small 12, No. 36, 2016: 4922-4935 (14 pages).
Zhang et al., "CE4-related: History-based Motion Vector Prediction" , Document: JVET-K0104-v5, Joint Video Experts Team (JVET) 11th Meeting: Ljubljana, SI, Jul. 10-18, 2018, 7 pages.
Damghanian, et al., "Image sensor comprising a color splitter with two different refractive indexes", 21 pages.
Tao et al., "Design of polarization-dependent color filters based on all-dielectric metasurfaces for dynamic modulation of color HSV", 11th International Congress on Engineered Materials Platforms for Novel Wave Phenomena (Metamaterials), 2017, 3 pages.
Zheng et al., "Optical trapping with focused Airy beams", Applied Optics vol. 50, Issue 1, pp. 43-49 (2011) https://doi.org/10.1364/AO.50.000043.
Čižmár et al., "Optical conveyor belt for delivery of submicron objects",Applied Physics Letters, vol. 86, Issue 17, Apr. 25, 2005, 3 pages.
Gordon, "Radiation Forces and Momenta in Dielectric Media", Phys. Rev. A vol. 8, 14—Published Jul. 1, 1973, 8 pages. Available online at: http://totuvach.free.fr/Articles/gordon73.pdf.
Mahani, et al., "Optimization of plasmonic color filters for CMOS image sensors by genetic algorithm", 2nd Conference on Swarm Intelligence and Evolutionary Computation (CSIEC), 2017, 4 pages.

Bosanac, et al., "Efficient Optical Trapping and Visualization of Silver Nanoparticles", Nano Letters 2008, vol. 8, No. 5, pp. 1486-1491.
Wang, et al., "Trapping and manipulating nanoparticles in photonic nanojets", Optics Letters, Apr. 2016, DOI: 10.1364/OL 41.001652, 4 pages.
Garcés-Chávez et al., "Simultaneous micromanipulation in multiple planes using a self-reconstructing light beam", Nature vol. 419, Sep. 12, 2002, 145-147.
Tsampoula, et al., "Femtosecond cellular transfection using a nondiffracting light beam", Applied Physics Letters, vol. 91, Issue 5, Jul. 30, 2007.
Berry et al., "Nonspreading wave packets", American Journal of Physics, vol. 47, Iss. Mar. 3, 1979.
Zhang, et al., "Trapping and guiding microparticles with morphing autofocusing Airy beams", Optics Letters, vol. 36, Issue 15, pp. 2883-2885 (2011).
Siviloglou, et al., "Observation of Accelerating Airy Beams", Physics Review Letters, vol. 99, Iss. 21—Published Nov. 20, 2007.
Lotti, et al., "Nanoparticle-based metasurfaces for angular-independent spectral filtering applications", 2017 Conference on Lasers and Electro-Optics Europe & European Quantum Electronics Conference (CLEO/Europe-EQEC), 2017.
Ashkin et al., "Observation of a single-beam gradient force optical trap for dielectric particles", Optics Letters vol. 11, Issue 5, pp. 288-290 (1986).
Cui et al., "Optical forces on metallic nanoparticles induced by a photonic nanojet", Optics Express, vol. 16, Issue 18, pp. 13560-13568 (Oct. 2008).
Devore, "Refractive Indices of Rutile and Sphalerite," J. Opt. Soc. Am. 41, pp. 416-419, 1951 (4 pages).
Jones et al., "Trapping and manipulation of microscopic bubbles with a scanning optical tweezer", Applied Physics Letters, vol. 89, Issue 8, Aug. 21, 2006.
Neves, "Photoni nanojets in optical tweezers," Journal of Quantitative Spectroscopy and Radiative Transfer 162, Mar. 17, 2015, 20 pages.
Block et al., "Bead movement by single kinesin molecules studied with optical tweezers", Nature, vol. 348, pp. 348-352 (1990).
Ahskin et al., "Optical trapping and manipulation of viruses and bacteria", Science, Mar. 20, 1987, vol. 235, Issue 4795, pp. 1517-1520.
Siviloglou et al., "Accelerating finite energy Airy beams", Apr. 15, 2007, vol. 32, No. 8, Optics Letters, pp. 979-981.
Liu et al., "Total internal reflection diffraction grating in conical mounting and its application in planar display", International Conference on Photonics and Optical Engineering (icPOE 2014), vol. 9449, pp. 9449-9449-6, 2015.
Levola, T., "Diffractive optics for virtual reality displays", Journal of the Society for Information Display 14, No. 5, 2006 pp. 467-475 (9 pages).
Yannopapas, "Photonic nanojets as three-dimensional optical atom traps: A theoretical study", Optics Communications, vol. 285, Issue 12, pp. 2952-2955, Jun. 1, 2012, 3 pages.
Eisen et al., "Total internal reflection diffraction grating in conical mounting," Optics communications 261, No. 1, 2006, pp. 13-18 (6 pages).
Zhanjun, "Virtual display design using waveguide hologram in conical mounting configuration", Optical Engineering, 50:50-50-9, 2011.

* cited by examiner

Incident electromagnetic wave

Incident electromagnetic wave

Incident electromagnetic wave

Incident electromagnetic wave

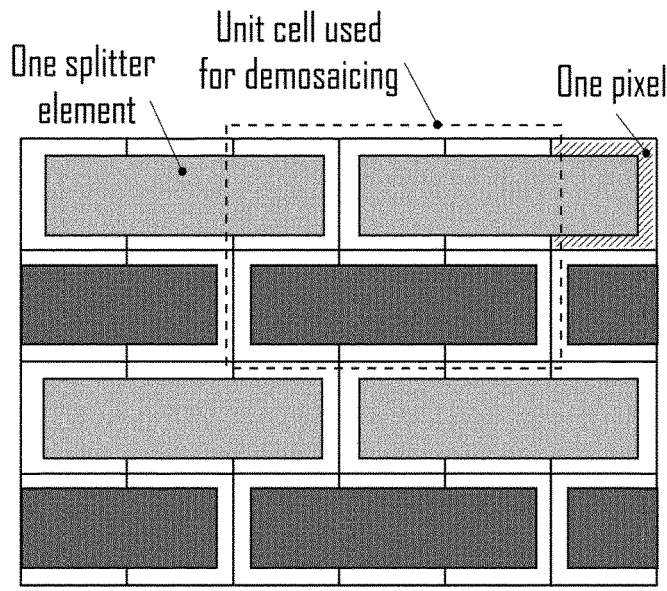

Arrangements of splitter elements on top of the 2D array of sensor pixels:

a) 
- Blue splitter (splitting the incoming white light to blue (B) in the center and white minus blue (W-B) on the sides
- Green splitter (splitting the incoming white light to green (G) in the center and white minus green (W-G) on the sides b)
- Red splitter (splitting the incoming white light to red (R) in the center and white minus red (W-R) on the sides
- Green splitter (splitting the incoming white light to green (G) in the center and white minus green (W-G) on the sides c)
- Blue splitter (splitting the incoming white light to blue (B) in the center and white minus blue (W-B) on the sides
- Red splitter (splitting the incoming white light to red (R) in the center and white minus red (W-R) on the sides

Figure 13

| W-B | B | W-B | W-B | B | W-B |
|-----|---|-----|-----|---|-----|
| G | W-G | W-G | G | W-G | W-G |
| W-B | B | W-B | W-B | B | W-B |
| G | W-G | W-G | G | W-G | W-G |

What sensor records $$\begin{bmatrix} R \\ G \\ B \end{bmatrix} = \begin{bmatrix} 1 & -1 & 1 \\ -1 & 1 & 1 \end{bmatrix} \begin{bmatrix} 1 & -1 & 1 \\ 1 & 1 & 1 \end{bmatrix}$$

$$\begin{bmatrix} W-B = R+G \\ B \end{bmatrix} \begin{bmatrix} W-G = R+B \\ G \end{bmatrix}$$

Figure 14

| W-B | B | W-B | W-B | B | W-B |
|-----|---|-----|-----|---|-----|
| R | W-R | W-R | R | W-R | W-R |
| W-B | B | W-B | W-B | B | W-B |
| R | W-R | W-R | R | W-R | W-R |

What sensor records

Figure 15

| W-R | R | W-R | W-R | R | W-R |
|-----|-----|-----|-----|-----|-----|
| G | W-G | W-G | G | W-G | W-G |
| W-R | R | W-R | W-R | R | W-R |
| G | W-G | W-G | G | W-G | W-G |

What sensor records

Figure 16

IMAGE SENSOR COMPRISING A COLOR SPLITTER WITH TWO DIFFERENT REFRACTIVE INDEXES, AND DIFFERENT HEIGHT

CROSS-REFERENCE TO RELATED APPLICATIONS

The present application is a national stage application under 35 U.S.C. 371 of International Application No. PCT/EP2019/063739, entitled "IMAGE SENSOR COMPRISING A COLOR SPLITTER WITH TWO DIFFERENT REFRACTIVE INDEXES, AND DIFFERENT HEIGHT", filed on May 28, 2019, which claims benefit from European Patent Application Ser. No. 18305846.0, entitled "Image sensor comprising a color splitter with two different refractive indexes, and different height", filed Jul. 2, 2018.

1. TECHNICAL FIELD

The present disclosure relates to the field of optics and photonics, and more specifically to optical devices used in image sensors.

2. BACKGROUND ART

This section is intended to introduce the reader to various aspects of art, which may be related to various aspects of the present invention that are described and/or claimed below. This discussion is believed to be helpful in providing the reader with background information to facilitate a better understanding of the various aspects of the present invention. Accordingly, it should be understood that these statements are to be read in this light, and not as admissions of prior art.

In order to acquire color components during the acquisition of an image, usually an image sensor can either use a Bayer filter (which is a way of discretizing the color space, that requires the execution of a kind of interpolation later for generating a color image), or a Fovea sensor (being able to record three color components per pixel via a stack of color sensors, i.e. the color sensors are piled up on each other's).

A specific technique based on a dual material structure has been suggested in the European patent application n°18305265. However, the green deviation with such approach was not observed.

In order to provide alternatives to the known techniques, it is proposed in the following a specific structure/architecture for achieving the color splitting functionality within image sensors, that can perform a deviation for either the red, green or blue color.

3. SUMMARY

References in the specification to "one embodiment", "an embodiment", "an example embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In one aspect, it is proposed an image sensor comprising pixels for acquiring color information from incoming visible light. The image sensor is remarkable in that it comprises three pixels being partially covered by a color splitter structure for deviating only one color channel of said incoming visible light towards one of said three pixels, and for deviating other colors of said incoming visible light towards the other pixels among said three pixels, wherein the color splitter structure comprises a first, a second and a third parallelepiped structures arranged so that the first and the third parallelepiped structures are side by side and in contact with the second parallelepiped structure, and wherein the first and the third parallelepiped structures have same dimensions, and are made of a same dielectric material, with a refractive index $n_H$, and wherein said second parallelepiped structure being smaller in height compared to said first and third parallelepiped structures, and wherein said second parallelepiped structure being made of a dielectric material with a refractive index $n_L$, and wherein the refractive index $n_H$ is greater than the refractive index $n_L$.

In a variant, the image sensor is remarkable in that the first, second and third parallelepiped structures have all base angles equal to 90°.

In a variant, the image sensor is remarkable in that a height $H_1$ of the first and the third parallelepiped structures and a height $H_2$ of the second parallelepiped structure, verifies that the height $H_2$ being smaller than the height $H_1$, and wherein the first and the third parallelepiped structures have a same width $W_1$, and the second parallelepiped structure has a width $W_2$.

In a variant, the image sensor is remarkable in that the color splitter structure is comprised or embedded in a host medium having a refractive index n, and the color splitter structure deviates only the blue color component from said incoming visible light towards one of said three pixels, with the refractive index $n_H$ being equal to 2.2, the refractive index $n_L$ being equal to 1.5, the refractive index n being equal to 1, the width $W_1$ being equal to 600 nm, the width $W_2$ being equal to 200 nm, the height $H_1$ being equal to 500 nm and the height $H_2$ being equal to 200 nm.

In a variant, the image sensor is remarkable in that the color splitter structure is comprised or embedded in a host medium having a refractive index n, and the color splitter structure deviates only the green color component from said incoming visible light towards one of said three pixels, with the refractive index $n_H$ being equal to 2.2, the refractive index $n_L$ being equal to 1.5, the refractive index n being equal to 1, the width $W_1$ being equal to 600 nm, the width $W_2$ being equal to 600 nm, the height $H_1$ being equal to 600 nm and the height $H_2$ being equal to 250 nm.

In a variant, the image sensor is remarkable in that the color splitter structure is comprised or embedded in a host medium having a refractive index n, and the color splitter structure deviates only the red color component from said incoming visible light towards one of said three pixels, with the refractive index $n_H$ being equal to 1.8, the refractive index $n_L$ being equal to 1.6, the refractive index n being equal to 1, the width $W_1$ being equal to 600 nm, the width $W_2$ being equal to 600 nm, the height $H_1$ being equal to 900 nm and the height $H_2$ being equal to 200 nm.

4. BRIEF DESCRIPTION OF THE DRAWINGS

The present disclosure can be better understood with reference to the following description and drawings, given by way of example and not limiting the scope of protection, and in which:

FIG. 1(a) presents a side view of a color splitter structure according to one embodiment of the disclosure and FIG. 1(b) presents a top view of a color splitter structure according to one embodiment of the disclosure;

FIG. 2 and FIGS. 3(a), 3(b) present the orientation of some nanojets generated by a color splitter structure according to one embodiment of the disclosure;

FIGS. 4(a) and 4(b) present respectively the power density distribution in xz-plane for single and double material elements (the double material element corresponding to the color splitter structure according to one embodiment of the disclosure);

FIG. 5 presents a power density distribution in the hot spot for the double material element (or color splitter element) with the parameters: n=1.0, $n_H$=2.2, $H_1$=600 nm, $H_2$=400 nm, $W_1$=600 nm, $W_2$=600 nm, $W_3$=200 nm, $W_4$=600 nm, $W_5$=700 nm;

FIGS. 6(a), (b) and (c) present the power density distribution in the hot spot for the double material element (or color splitter structure) with some specific parameters;

FIG. 7 presents the power density distribution in the hot spot for the double material element (or color splitter structure) with the following parameters: n=1.0, $n_H$=2.2, $n_L$=1.5, $H_1$=600 nm, $H_2$=400 nm, $W_1$=600 nm, $W_2$=600 nm, $W_4$=600 nm, $W_5$=700 nm;

FIG. 8 presents the power density distribution in the hot spot for the double material structure (or color splitter structure) with the following parameters:n=1.0, $n_H$=2.2, $n_L$=1.5, $H_1$=600 nm, $H_2$=400 nm, $W_1$=600 nm, $W_2$=600 nm, $W_3$=100 nm, $W_4$=600 nm;

FIG. 9 presents the power density distribution for the double material structure (or color splitter structure) with the parameters: n=1.0, $W_1$=600 nm, $W_4$=600 nm, $W_5$=700 nm;

FIG. 10 presents a blue color splitter according to one embodiment of the disclosure which separates the full spectrum of the incoming light into two channels: Blue (B) in the centre and the rest (W−B=G+R) directed to the sides;

FIG. 13 illustrates different arrangement of the color splitter according to the present disclosure. The period for both splitter elements is 2 μm and the pixel pitch is 667 nm, which indicates that each splitter element (including the spacing between two neighbouring splitters) feeds exactly three pixels;

FIG. 14 provides clarifications on the information recorded by the pixels of an image sensor according to the embodiment of the disclosure mentioned in the section a) of FIG. 13;

FIG. 15 provides clarifications on the information recorded by the pixels of an image sensor according to the embodiment of the disclosure mentioned in the section b) of FIG. 13;

FIG. 16 provides clarifications on the information recorded by the pixels of an image sensor according to the embodiment of the disclosure mentioned in the section c) of FIG. 13.

DETAILED DESCRIPTION

The present disclosure relates to a modification of the technique described in the European patent application n° 18305265. More precisely, it is proposed to modify the technique of European patent application n° 18305265 in order to deviate also green light.

Figure 1A:
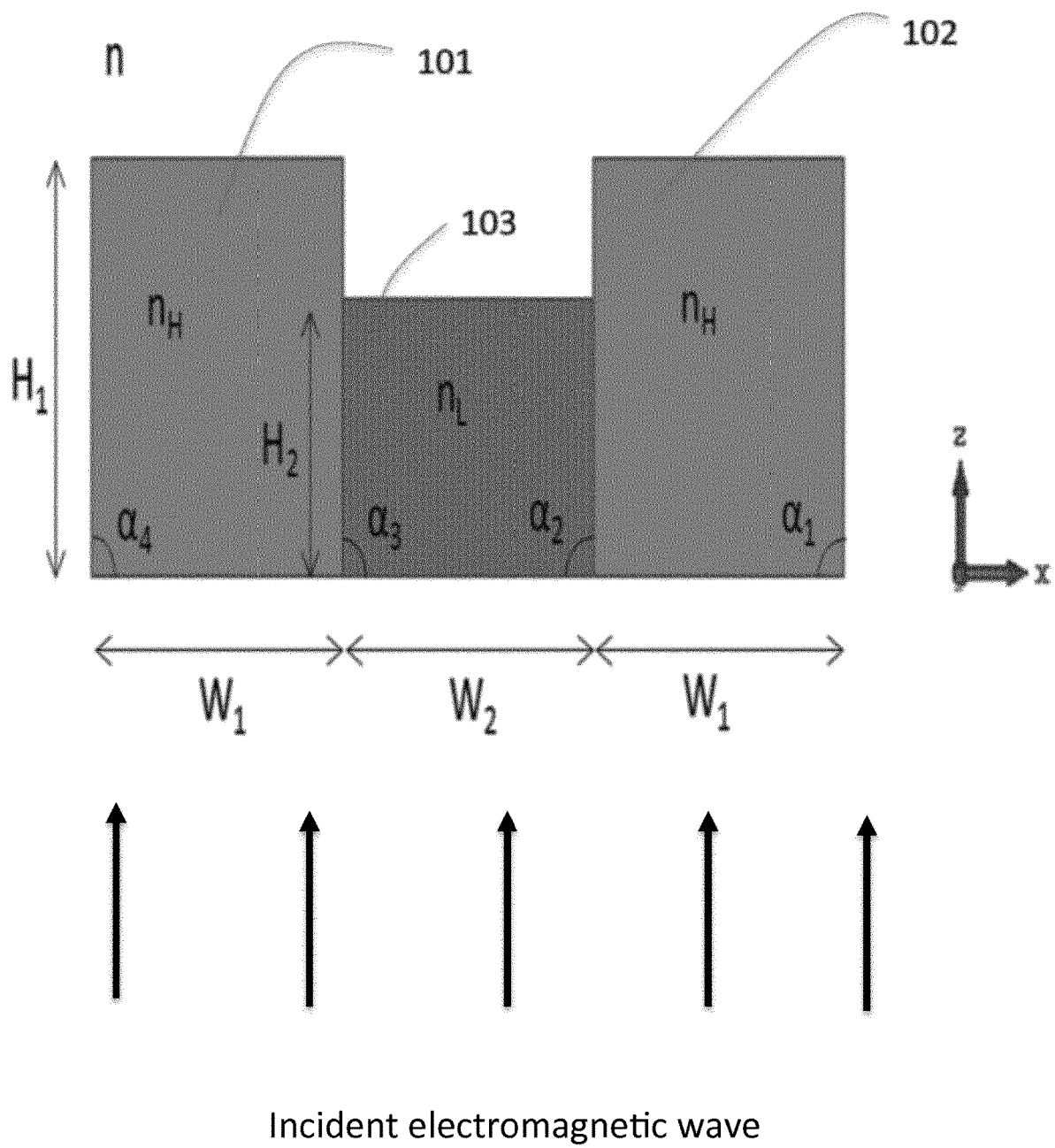

FIG. 1(a) presents a side view of a color splitter structure according to one embodiment of the disclosure.

More precisely, the FIG. 1(a) is a cross-section view of a color splitter structure, wherein the color splitter structure comprises two parallelepiped structures referenced 101 and 102, made of a same dielectric material having a refractive index equal to $n_H$. The two parallelepiped structures 101, 102 sandwich a third structure referenced 103, made of a dielectric material having a refractive index equal to $n_L$.

The parallelepiped structures 101 has a width $W_1$ and a height $H_1$.

The parallelepiped structures 102 has a width $W_1$ and a height $H_1$.

The parallelepiped structures 103 has a width $W_2$ and a height $H_2$, which is smaller than the one from the height $H_1$.

In addition, the color splitter structure is comprised or embedded in a host medium having a refractive index n, which is lower than the refractive index $n_H$.

The parallelepiped structures 101, 102 and 103 are also defined by base angles $\alpha_1$, $\alpha_2$, $\alpha_3$, $\alpha_4$.

In the FIG. 1(a), we have $\alpha_1=\alpha_2=\alpha_3=\alpha_4=90°$.

When an incoming white light is hitting the color splitter structure, then jet waves are generated by the edges of the color splitter structure, as already explained in documents WO 2017-162880 and WO2017-162882.

Figure 1B:
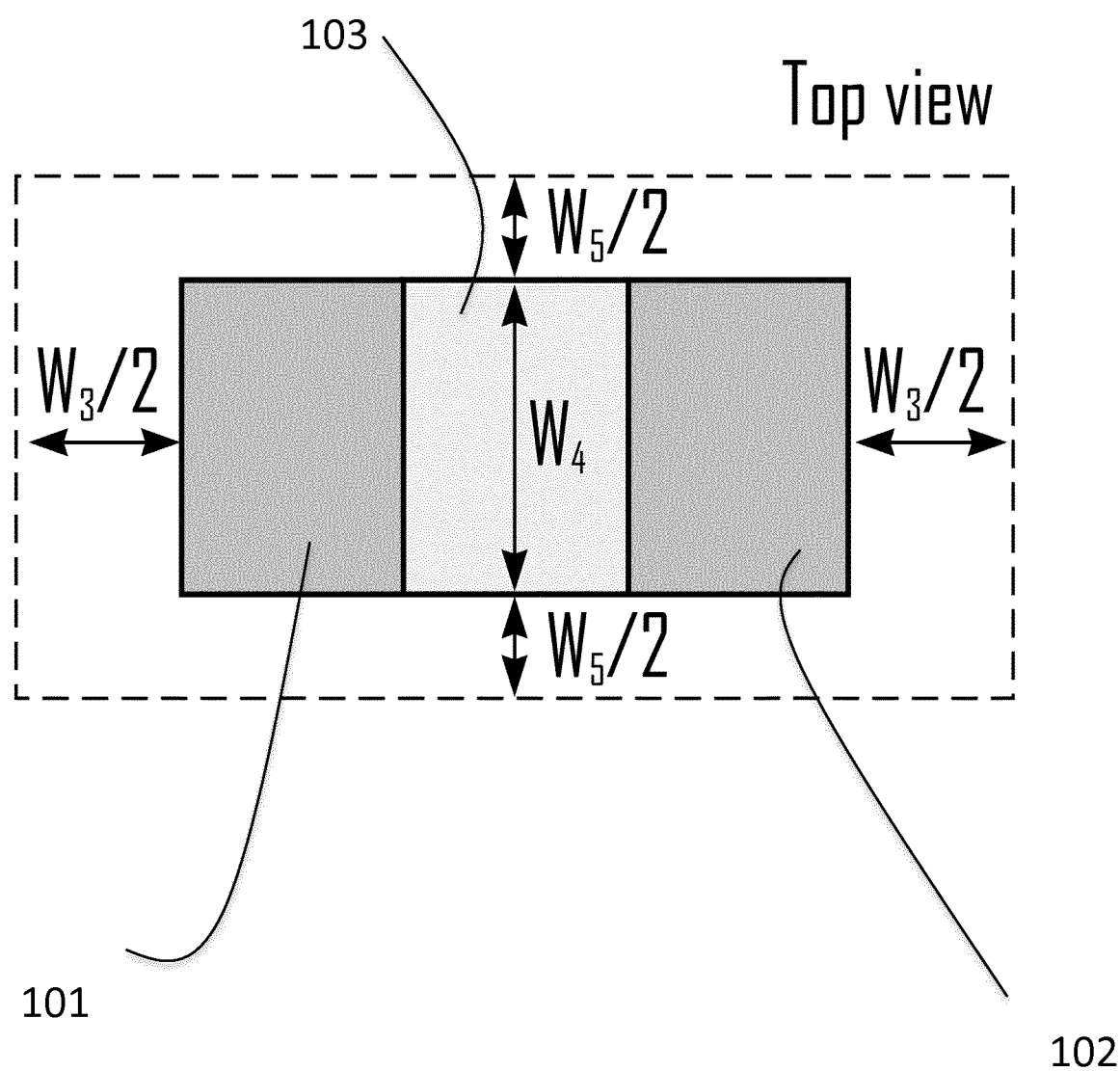

FIG. 1(b) presents a top view of a color splitter structure according to one embodiment of the disclosure.

More precisely, it presents a width $W_4$ that is a value that can be viewed as a thickness of parallelepiped structures 101, 102 and 103. In addition, the distances $W_3$ and $W_S$ correspond to the distances between the parallelepiped structures of the color splitter to another color splitter. Hence, the depth of a pixel is equal to $W_S+W_4$, the width of the pixel is equal to $(W_3+2*W_1+W_2)/3$.

Figure 2:
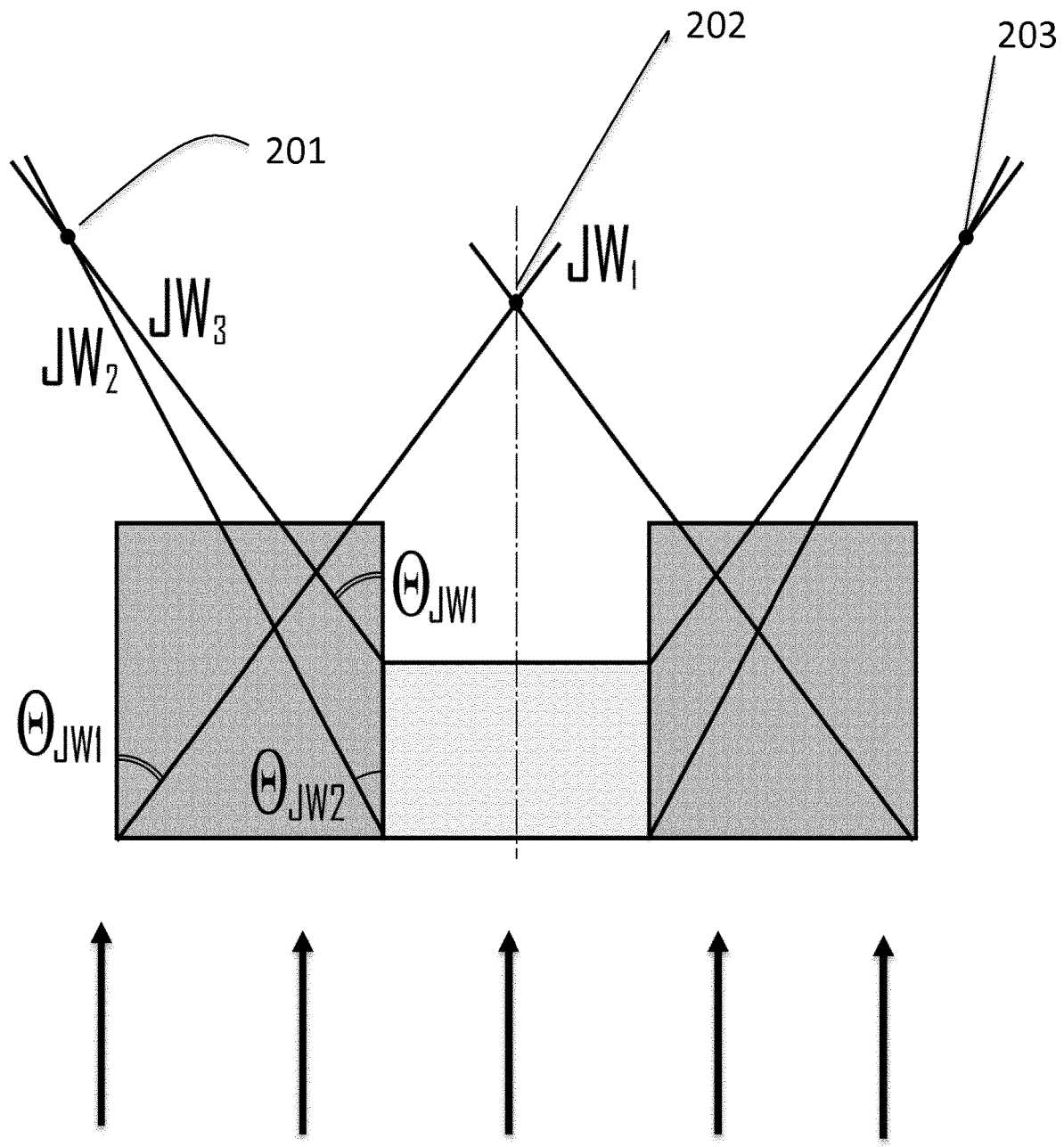
Figure 3A:
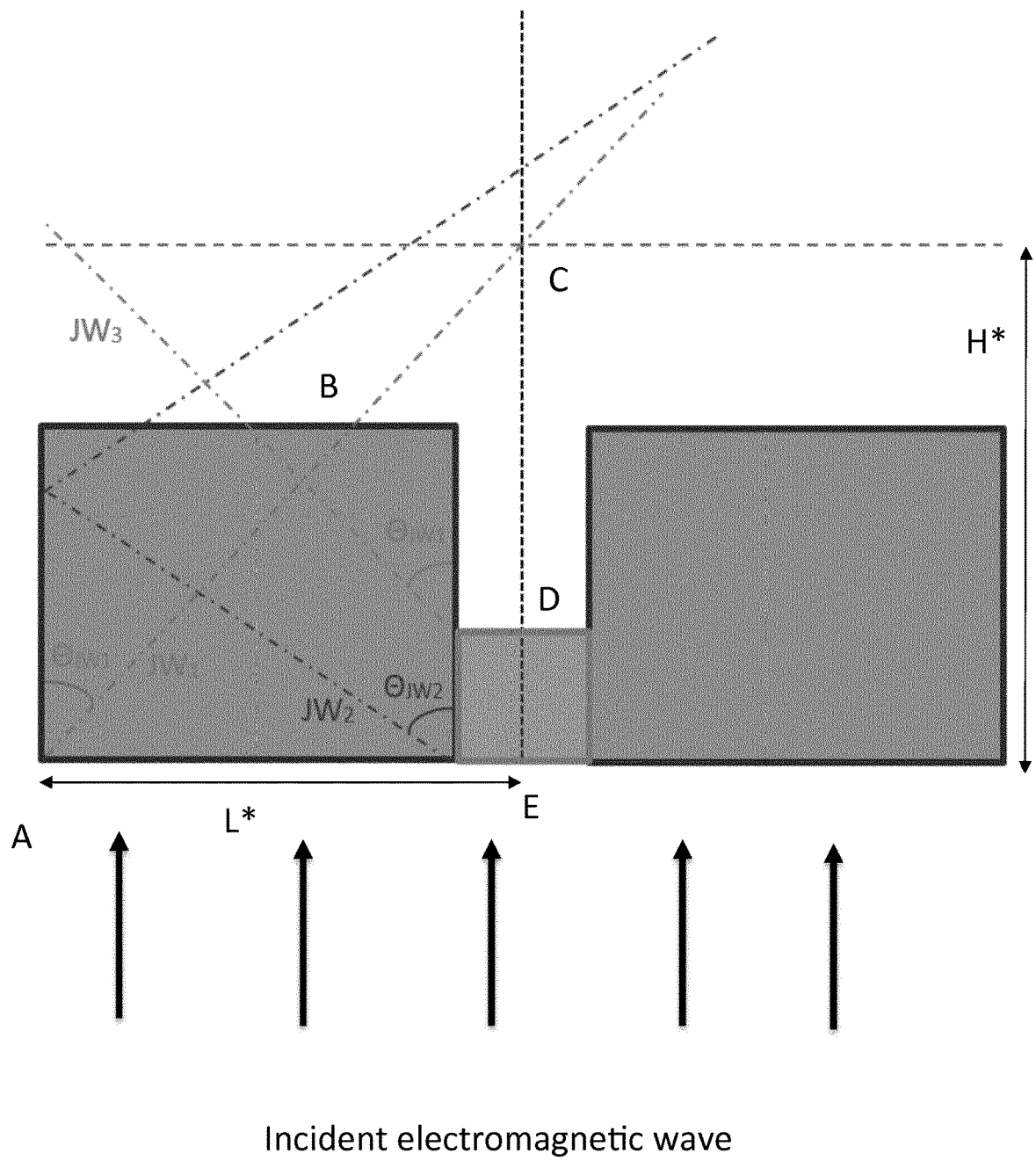
Figure 3B:
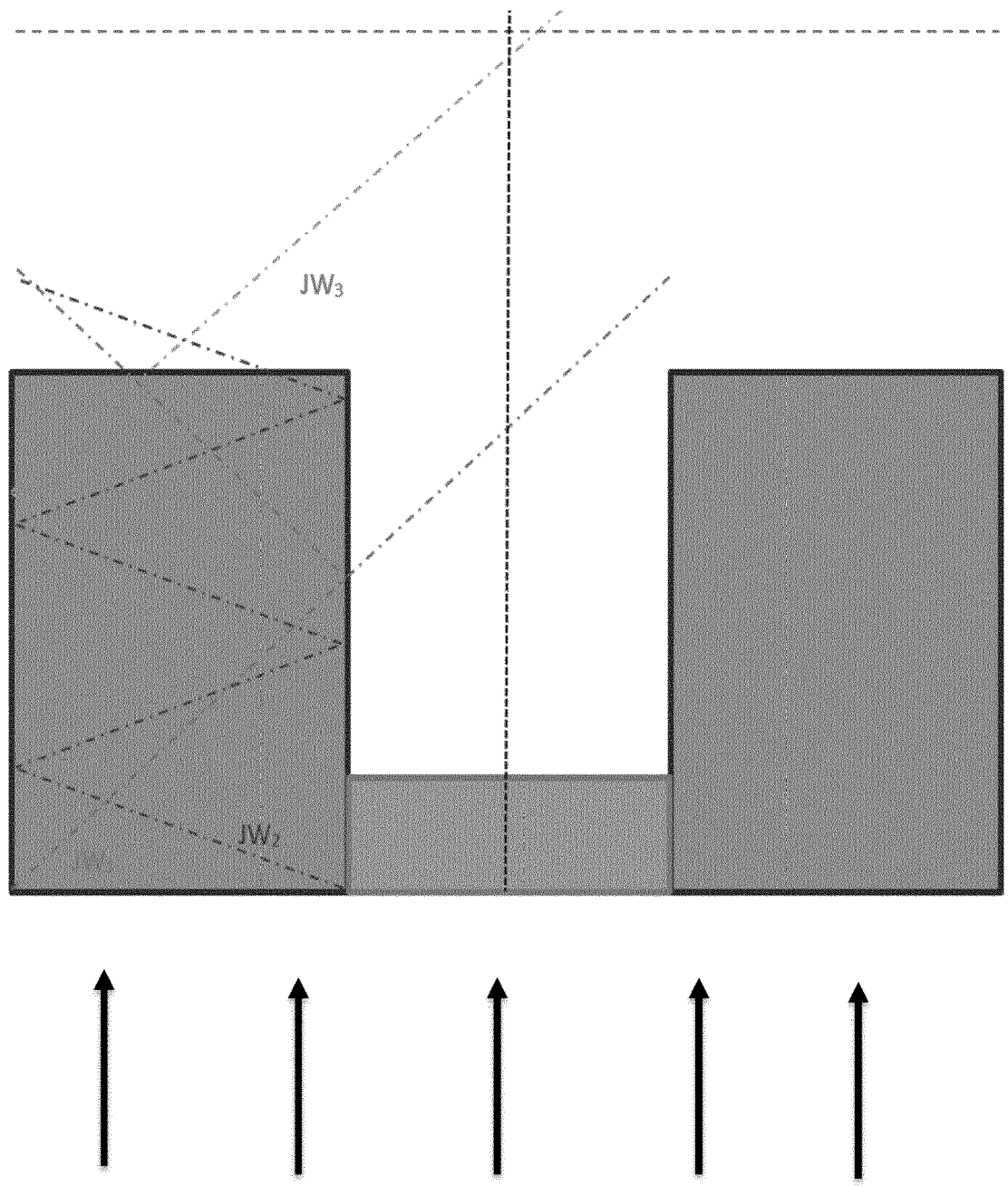

FIG. 2 and FIGS. 3(a), 3(b) present the orientation of the jet waves generated by a color splitter structure according to one embodiment of the disclosure.

Indeed, when illuminated, the color splitter structure generates nanojet beams resulting from the interference between plane wave and jet waves, references 201, 202 and 203, diffracted by the edges of the blocks of the structure at the angles $\theta_{JW1}$ and $\theta_{JW2}$ where $$\theta_{JW1} \approx 90° - \cos^{-1}\left(\sqrt{\frac{n_H}{n}}\right),$$

$$\theta_{JW2} \approx 90° - \cos^{-1}\left(\sqrt{\frac{n_L}{n_H}}\right).$$

The constructive interference between these jet waves and plane waves leads to the creation of the set of new spectral-dependent NJ beams.

FIGS. 3(a) and 3(b) show possible refraction of the jet waves associated with the different edges, due to the change of the parameters of the system.

It can be demonstrated that by changing the dimensions of the parallelepiped structures we can have the nanojets (also noted NJ) beams or hot spots positioned above the surface of the structure along the axis of the symmetry of the elements at different wavelengths. Such response of the color splitter structure corresponds to the constructive interference between the jet waves and plane wave propagating through the central parallelepiped structure of the color splitter structure. To get the maximal intensity of this NJ we should find the optimal parameters of the system taking into account the phases of the jet waves generated by the parallelepiped structures with highest refractive index and plane waves generated outside this block. It means that for example the optical path difference (OPD) for JW1 and plane wave refracted by the central block should satisfy the condition:

$$OPD=m\lambda,$$

where m=0, ±1, ±2, . . . .
Let us determine the OPD as $$OPD = n_H AB + nBC - nCD - n_L DE.$$

As the result we obtain that $$OPD \approx (n_H - n)\frac{H_1}{\cos\Theta_{JW1}} - (n_L - n)H_2 + nL^*\left(\frac{1}{\sin\Theta_{JW1}} - \frac{1}{\tan\Theta_{JW1}}\right),$$

where $$L^* = W_1 + \frac{W_2}{2}.$$

To calculate the distance of the corresponding hot spot detection, we use an approximate formula:

$$H^* \approx \frac{L^*}{\tan\Theta_{JW1}}$$

It is necessary to mention that the properties of this system depend on the materials and sizes of the blocks. We additionally should take into account the refraction of JWs inside the elements with refractive index $n_H$ (see FIG. 3(a), for example). Due to the refraction of $JW_2$ inside this element we can get the additional NJ hot spot along the axis of the symmetry of this system. But the phases of the jet waves generated by the opposite edges of the elements will be different. It means that the optical path difference (OPD) for $JW_2$ and plane wave propagating through the central block should satisfy the condition:

$$OPD \approx \left(m + \frac{1}{2}\right)\lambda,$$

where m=0, ±1, ±2, . . . .

It should be also noted that that the color splitting property of the proposed structure is not limited to the structures with vertical base angles ($\alpha_j$=90°). Indeed, it is still possible to achieve the excepted goal with base angles from 80o to 110°.

Moreover, the color splitting functionality is not limited to the normal incident light (0=00), but it exists for inclined incident light as well.

Indeed, normal incidence happens at 0=0°, but the color splitting structure can perform the splitting function with the following range of tolerance −15°<0<15°.

Figure 4:
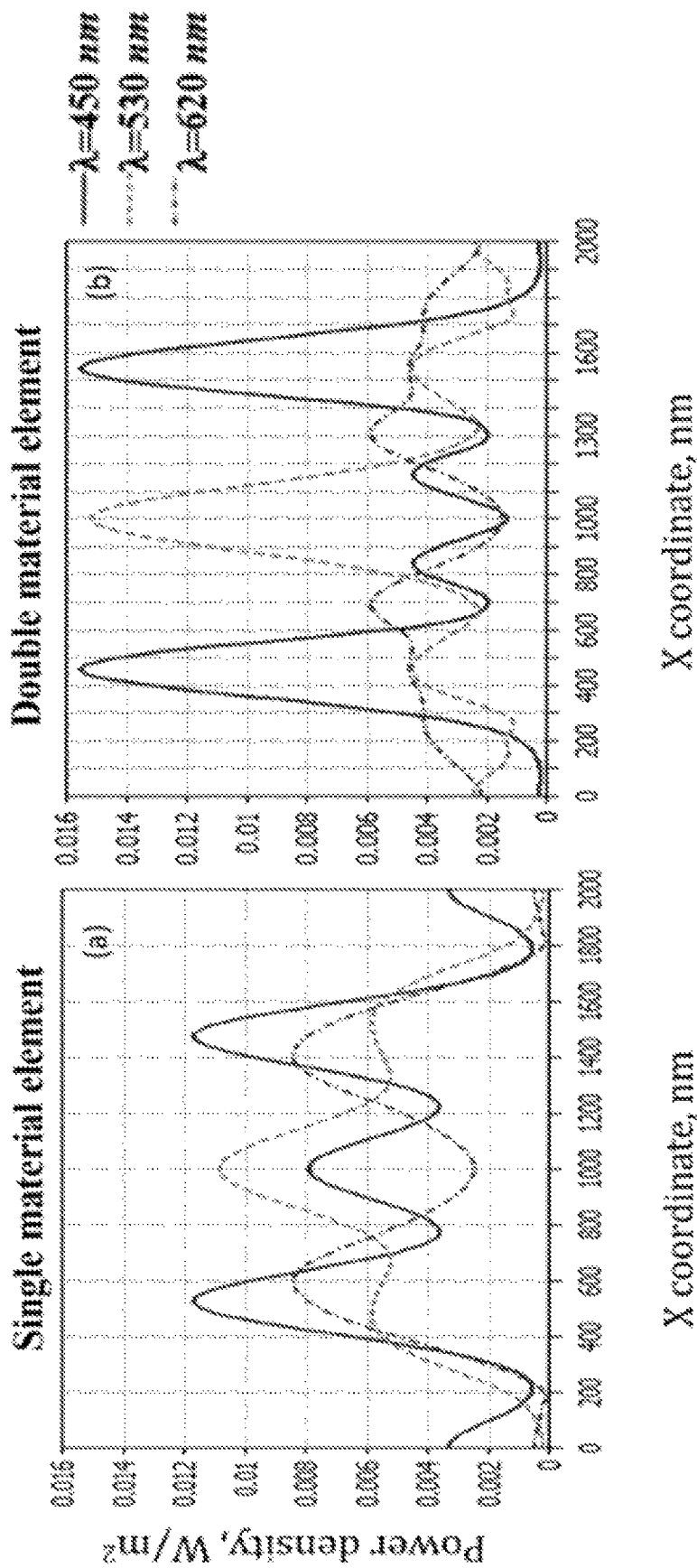

FIGS. 4(a) and 4(b) present the power density distribution in xz-plane for single (FIG. 4a) and double material (FIG. 4b) elements to demonstrate the input from the parallelepiped structures 102 with refractive index $n_L$ at Z=800 nm (we assume that Z=0 corresponds to the bottom of the system).

More precisely, the parameters of the structures of FIGS. 4(a) and 4(b) are the following:
n=1.0, $W_1$=600 nm, $W_2$=600 nm, $W_3$=200 nm, $W_4$=600 nm, $W_5$=700 nm;
(a) $n_H$=$n_L$=2.2, $H_{1,2}$=600 nm;
(b) $n_H$=2.2, $n_L$=1.5, $H_1$=600 nm, $H_2$=250 nm.

At X=1000 nm (middle of the system, FIG. 4b) we can observe intensive response of the system at the wavelength corresponding to the green color. Red and blue colors will be almost suppressed. The full analysis of JW distribution and interference, demonstrates that at this distance from the top of the element the main input will be provided by the NJ obtained as the result of constructive interference between the JW1 and plane wave refracted by the central block. The schematic distribution of JWs in this system is provided below.

Figure 5:
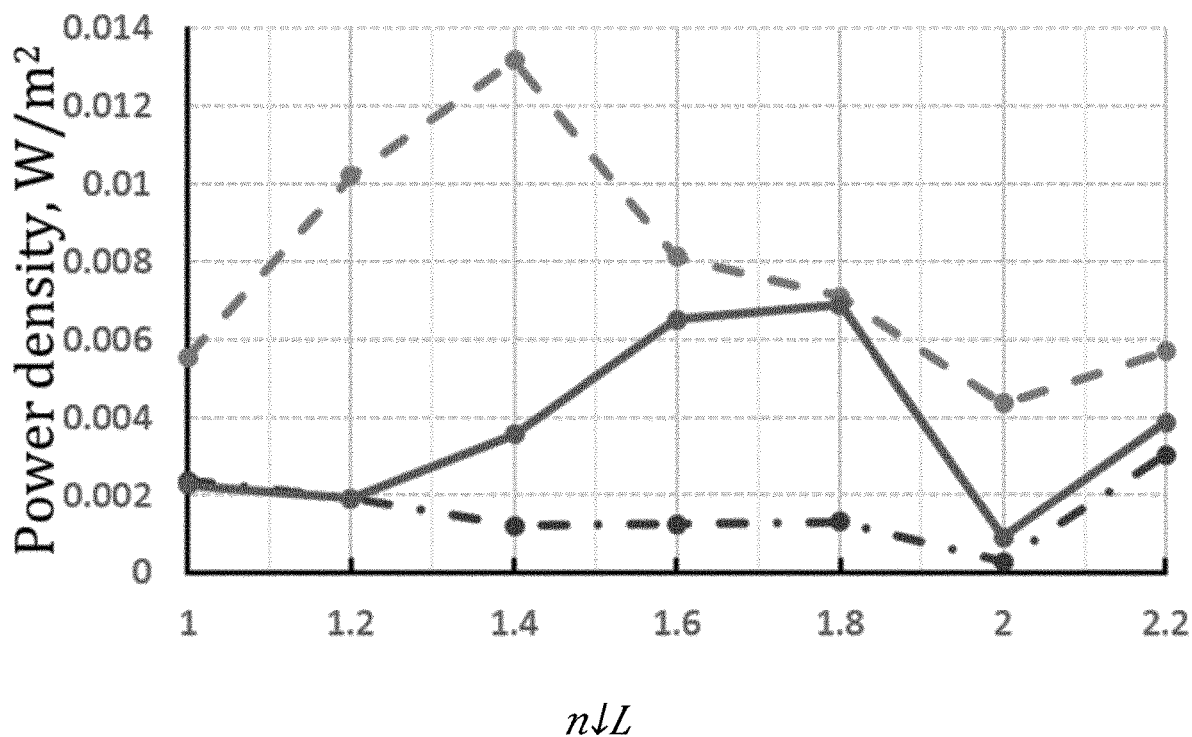

FIG. 5 presents a power density distribution in the hot spot for the double material element with the parameters: n=1.0, $n_H$=2.2, $H_1$=600 nm, $H_2$=400 nm, $W_1$=600 nm, $W_2$=600 nm, $W_3$=200 nm, $W_4$=600 nm, $W_5$=700 nm. For FIGS. 5, 6(a), 6(b), 6(c), 7 and 8, the legends of the solid lines, dashed lines and dashed-dotted lines are the same as for FIG. 4.

Figure 6A:
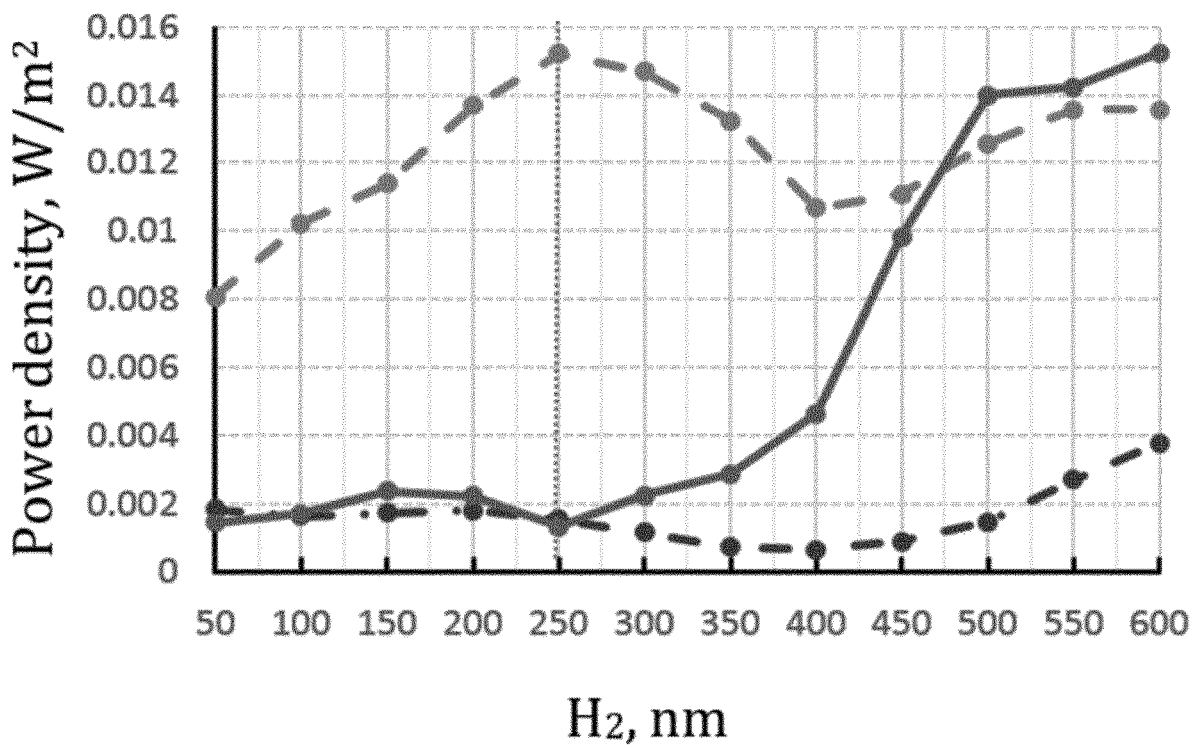
Figure 6B:
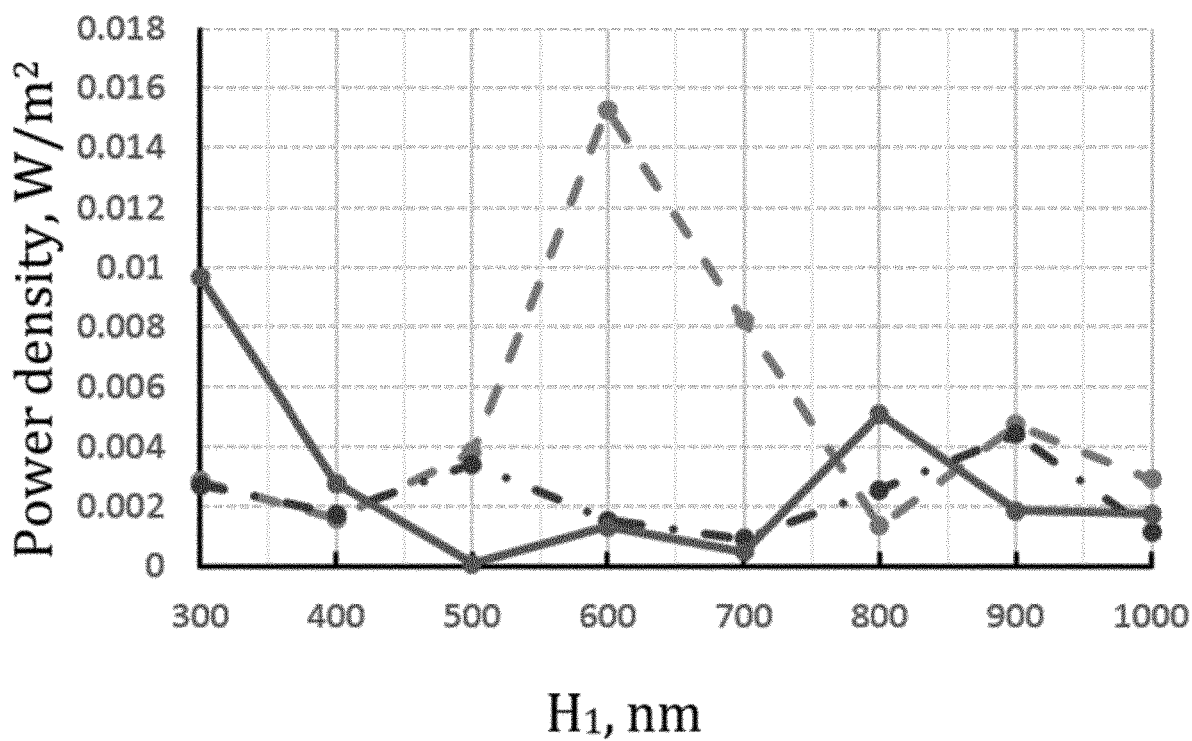
Figure 6C:
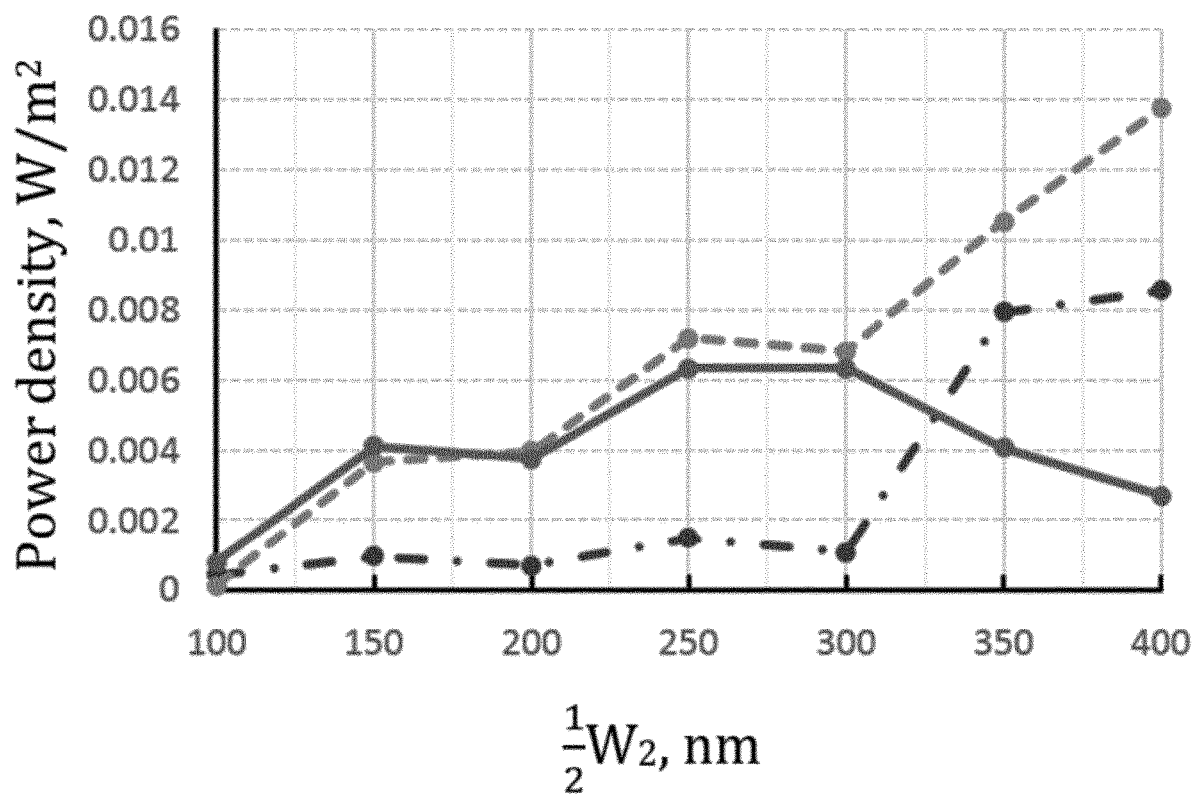

FIGS. 6(a), (b) and (c) present the power density distribution in the hot spot for the double material element with the parameters:
n=1.0, $n_H$=2.2, $n_L$=1.5, $W_1$=600 nm, $W_4$=600 nm, $W_5$=700 nm; (a)–$H_1$=600 nm, $W_2$=600 nm, $W_3$=200 nm; (b) $H_2$=250 nm, $W_2$=600 nm, $W_3$=200 nm; (c)–$H_1$=600 nm, $H_2$=400 nm, $W_3$=800 nm.

Figure 7:
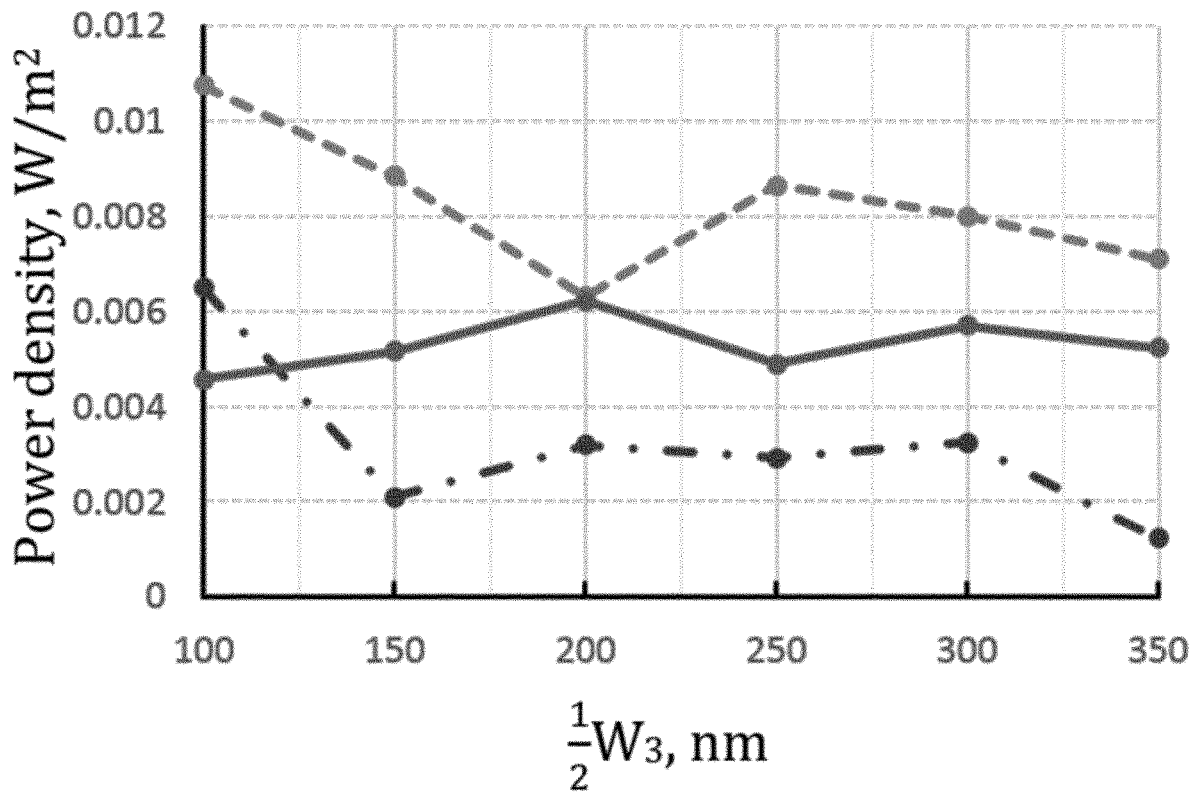

FIG. 7 presents the power density distribution in the hot spot for the double material element with the following parameters: n=1.0, $n_H$=2.2, $n_L$=1.5, $H_1$=600 nm, $H_2$=400 nm, $W_1$=600 nm, $W_2$=600 nm, $W_4$=600 nm, $W_5$=700 nm.

Figure 8:
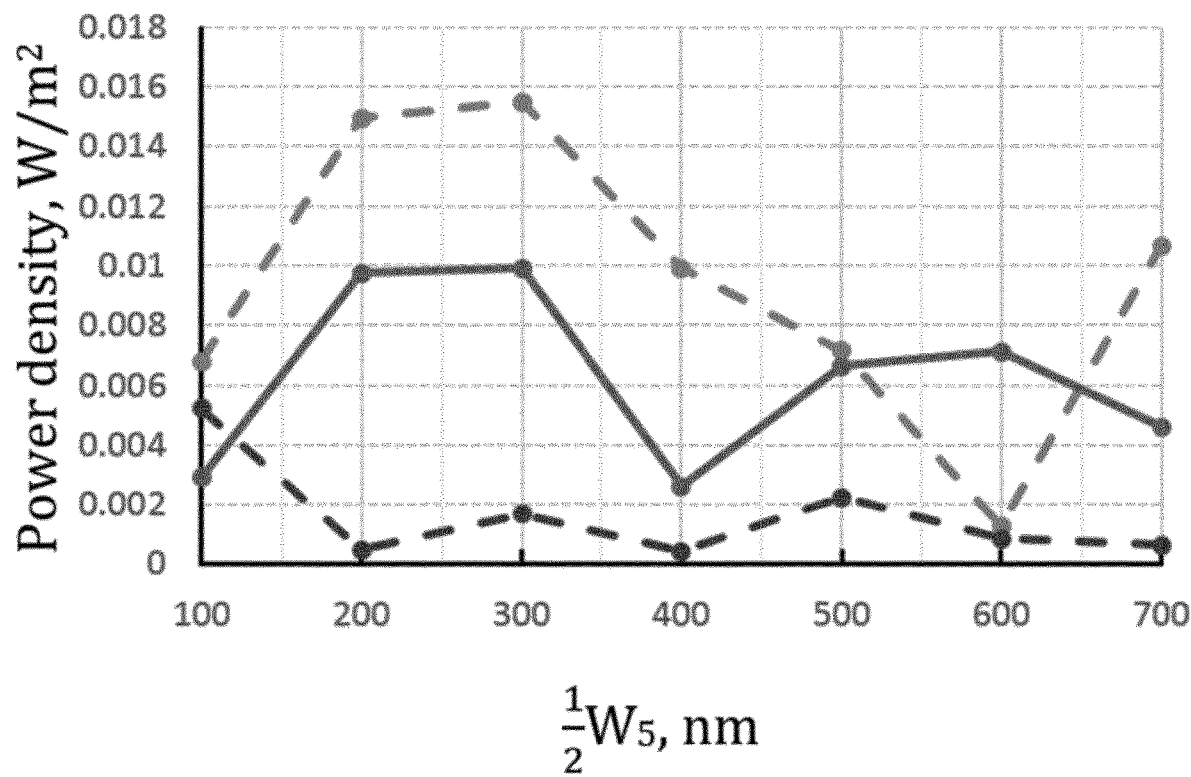

FIG. 8 presents the power density distribution in the hot spot for the double material element with the following parameters:n=1.0, $n_H$=2.2, $n_L$=1.5, $H_1$=600 nm, $H_2$=400 nm, $W_1$=600 nm, $W_2$=600 nm, $W_3$=100 nm, $W_4$=600 nm.

Due to the optimization of the parameters of the system we have obtained the solutions for tree different color splitters. The comparison of power density distribution for single and double material elements is presented in FIG. 9. Ot is necessary to note that the total size of the elements is the same.

Figure 9:
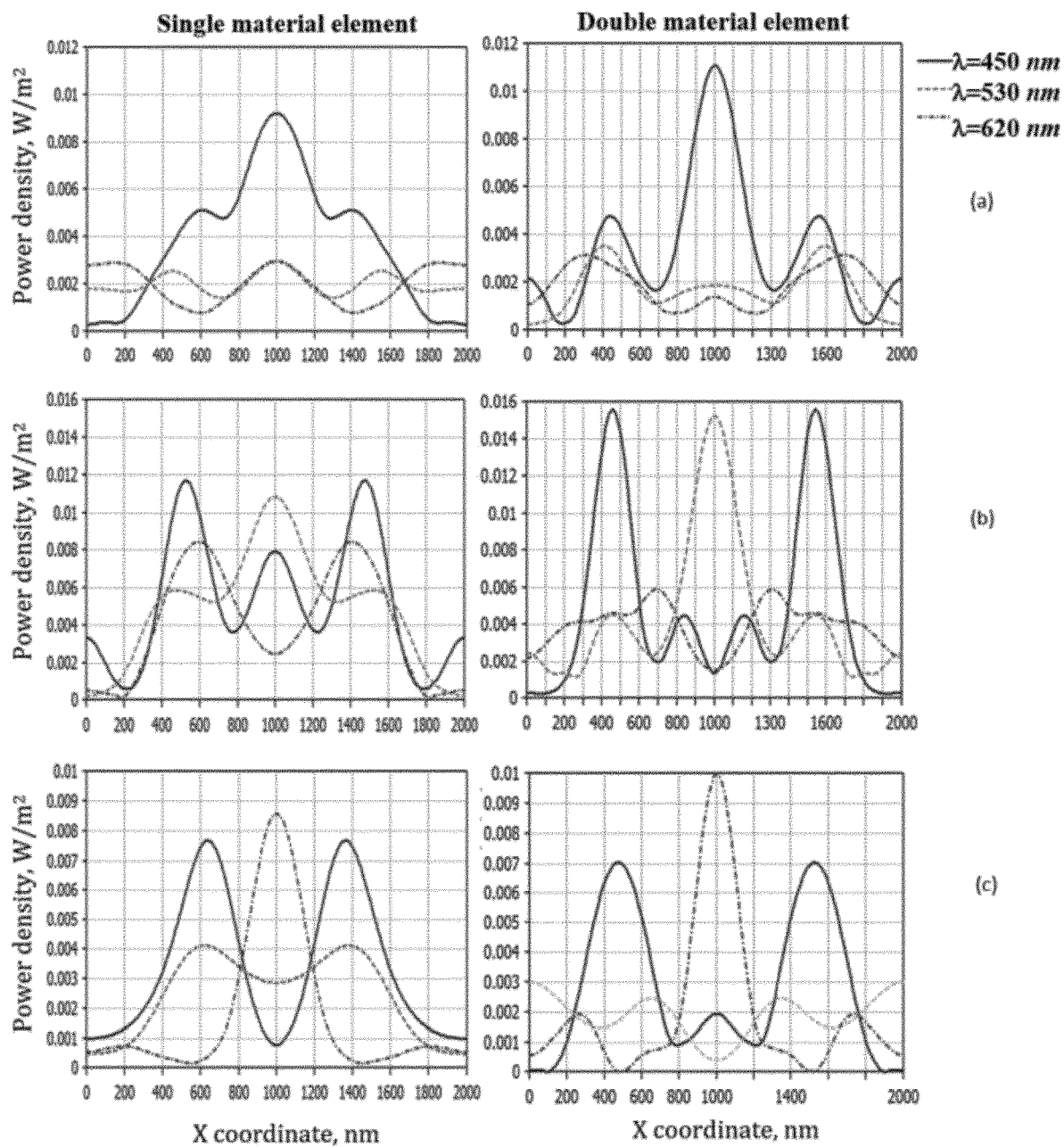

FIG. 9 presents the power density distribution for the double material elements with the parameters: n=1.0, $W_1$=600 nm, $W_4$=600 nm, $W_5$=700 nm;
(a) $n_H$=2.2, $n_L$=1.5, $H_1$=500 nm, $H_2$=200 nm, $W_2$=200 nm, $W_3$=600 nm, Z=800 nm;
(b) $n_H$=2.2, $n_L$=1.5, $H_1$=600 nm, $H_2$=250 nm, $W_2$=600 nm, $W_3$=200 nm, Z=800 nm;
(c) $n_H$=1.8, $n_L$=1.6, $H_1$=900 nm, $H_2$=200 nm, $W_2$=600 nm, $W_3$=200 nm, Z=1500 nm.

Figure 10:
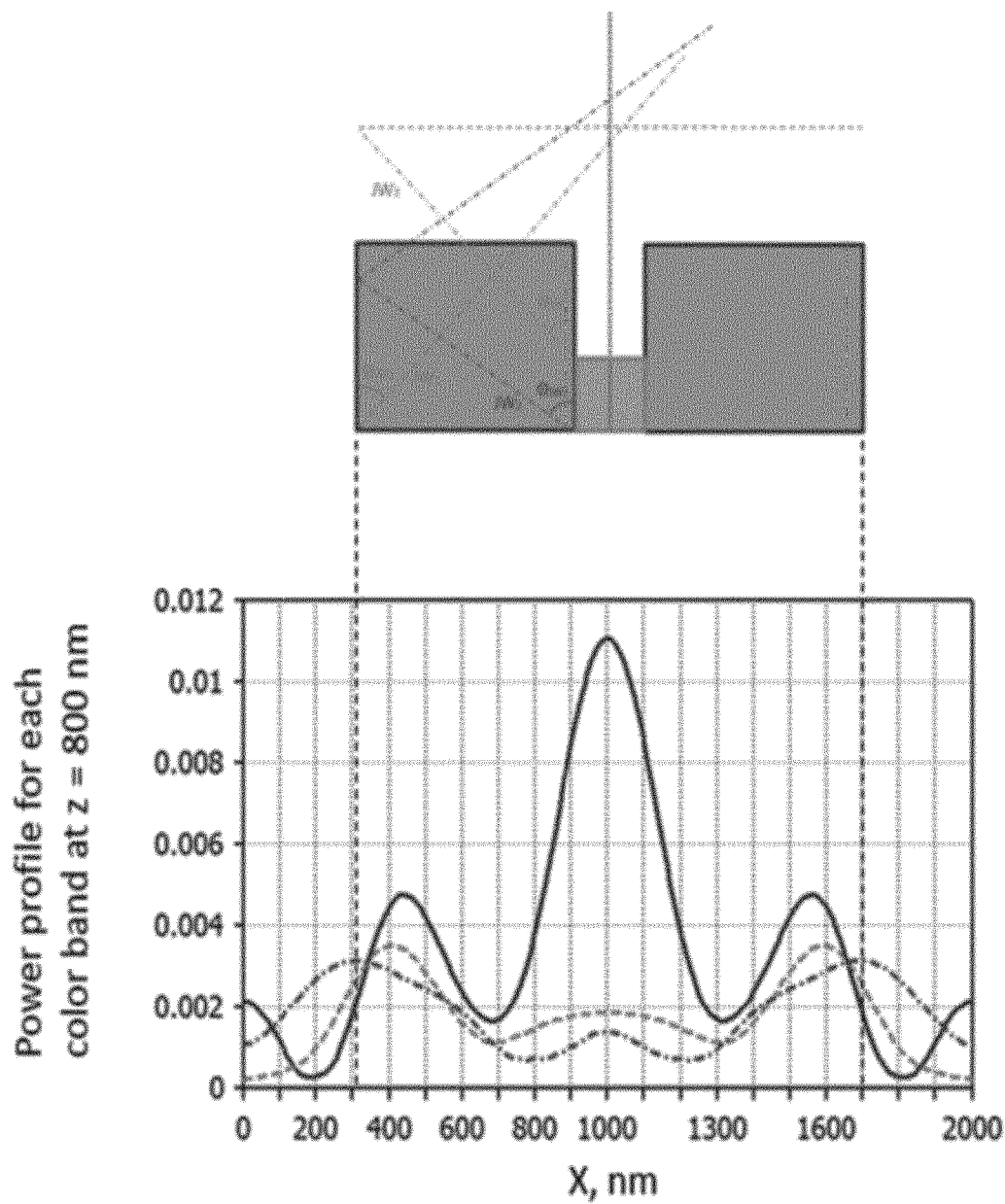

FIG. 10 presents a blue color splitter according to one embodiment of the disclosure which separates the full spectrum of the incoming light into two channels: Blue (B) in the centre and the rest (W−B=G+R) directed to the sides. For FIGS. 10, 11 and 12, the legends of the plotted solid lines, dashed lines and dashed-dotted lines are the same as for FIG. 9.

The total width of the splitter element is 1400 nm and together with the spacing between the neighboring elements (600 nm in this case) the pitch period of the splitter element becomes 2 μm. In such embodiment, the refractive index $n_H$ is equal to 2.2, and refractive index $n_L$ is equal to 1.5, the refractive index n is equal to 1, the width $W_1$ is equal to 600 nm, the width $W_2$ is equal to 200 nm, the height $H_1$ is equal to 500 nm and the height $H_2$ is equal to 200 nm.

Figure 11:
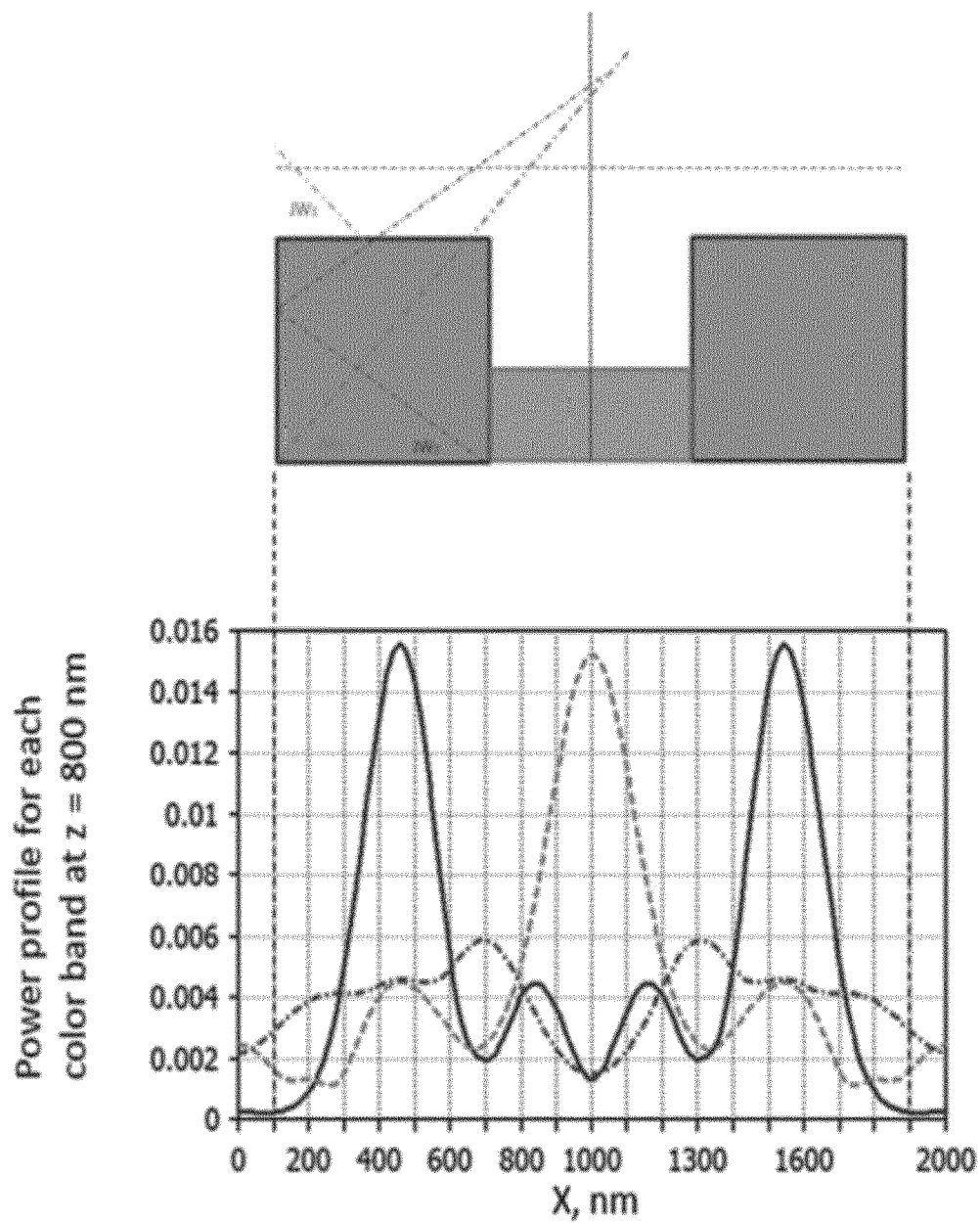
FIG. 11 illustrates a green color splitter which separates the full spectrum of the incoming light (R+G+B) into two channels: green (G) in the centre and the rest (W-G=B+R) directed to the sides.

FIG. 11 illustrates a green color splitter which separates the full spectrum of the incoming light (R+G+B) into two channels: green (G) in the centre and the rest (W-G=B+R) directed to the sides.

The total width of the splitter element is 1800 nm and together with the spacing between the neighboring elements (200 nm in this case) the pitch period of the splitter element becomes 2 μm.

In such embodiment, the refractive index $n_H$ is equal to 2.2, a refractive index $n_L$ is equal to 1.5, the refractive index n is equal to 1, the width $W_1$ is equal to 600 nm, the width $W_2$ is equal to 600 nm, the height $H_1$ is equal to 600 nm and the height $H_2$ is equal to 250 nm.

Figure 12:
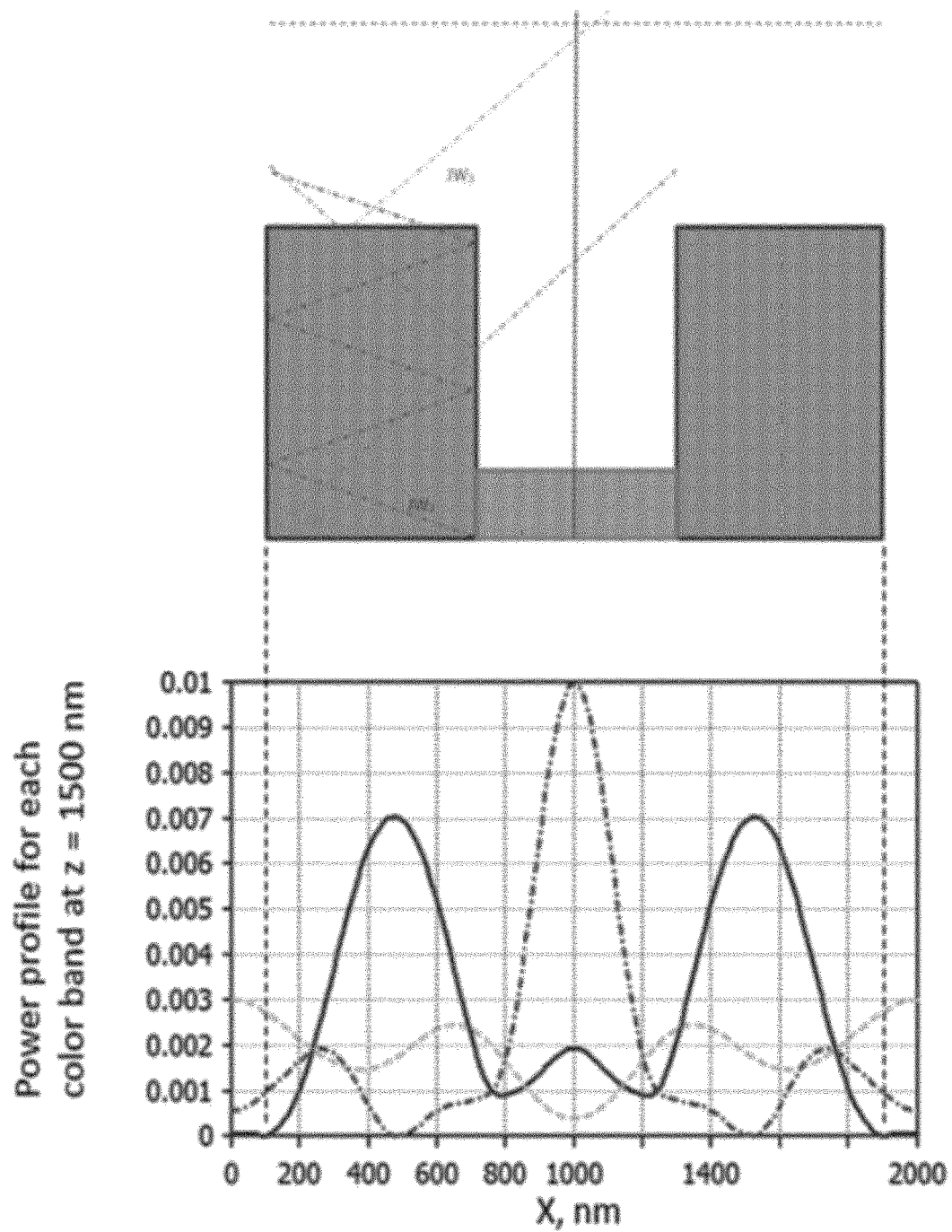
FIG. 12 illustrates a red color splitter which separates the full spectrum of the incoming light (R+G+B) into two channels: red (R) in the centre and the rest (W−R=B+G) directed to the sides.

FIG. 12 illustrates a red color splitter which separates the full spectrum of the incoming light (R+G+B) into two channels: red (R) in the centre and the rest (W-R=B+G) directed to the sides. The total width of the splitter element is 1800 nm and together with the spacing between the neighboring elements (200 nm in this case) the pitch period of the splitter element becomes 2 μm.

In such embodiment, the refractive index $n_H$ is equal to 1.8, a refractive index $n_L$ is equal to 1.6, the refractive index n is equal to 1, the width $W_1$ is equal to 600 nm, the width $W_2$ is equal to 600 nm, the height $H_1$ is equal to 900 nm and the height $H_2$ is equal to 200 nm.

FIG. 13 illustrates different arrangement of the color splitter according to the present disclosure. The period for both splitter elements is 2 μm and the pixel pitch is 667 nm, which indicates that each splitter element (including the spacing between two neighboring splitters) feeds exactly three pixels.

In one embodiment, the color splitters are used in combination with pixels which some or all use usual color filters. In this embodiment, the residues of the undesired wavelength in the split parts of the incoming light are filtered out using the usual color filters. Hence the crosstalk is minimized while the color splitters increase the light intake efficiency.

In another embodiment the image sensor has non-uniform pixel sizes. The size of the pixels is optimised depending the array of the color splitter elements for better color separation performance, light intake, etc.

FIG. 14 provides clarifications on the information recorded by the pixels of an image sensor according to the embodiment of the disclosure mentioned in the section a) of FIG. 13.

FIG. 15 provides clarifications on the information recorded by the pixels of an image sensor according to the embodiment of the disclosure mentioned in the section b) of FIG. 13.

FIG. 16 provides clarifications on the information recorded by the pixels of an image sensor according to the embodiment of the disclosure mentioned in the section c) of FIG. 13.

The invention claimed is:

1. An image sensor comprising pixels for acquiring color information from incoming visible light, wherein said image sensor comprising three pixels being partially covered by a color splitter structure for deviating only one color channel of said incoming visible light towards one of said three pixels, and for deviating other colors of said incoming visible light towards the other pixels among said three pixels, wherein the color splitter structure comprises a first, a second and a third parallelepiped structures arranged so that the first and the third parallelepiped structures are side by side and in contact with the second parallelepiped structure, and wherein the first and the third parallelepiped structures have same dimensions, and are made of a same dielectric material, with a refractive index $n_H$, and wherein said second parallelepiped structure being smaller in height compared to said first and third parallelepiped structures, and wherein said second parallelepiped structure being made of a dielectric material with a refractive index $n_L$.

2. The image sensor according to claim 1, wherein the first, second and third parallelepiped structures have all base angles equal to 90°.

3. The image sensor according to claim 1, wherein a height $H_1$ of the first and the third parallelepiped structures and a height $H_2$ of the second parallelepiped structure, verifies that the height $H_2$ being smaller than the height $H_1$, and wherein the first and the third parallelepiped structures have a same width $W_1$ and the second parallelepiped structure has a width $W_2$.

4. The image sensor according to claim 3, wherein the color splitter structure is comprised or embedded in a host medium having a refractive index n, and wherein the color splitter structure deviates only the blue color component from said incoming visible light towards one of said three pixels, with the refractive index $n_H$ being equal to 2.2, the refractive index $n_L$ being equal to 1.5, the refractive index n being equal to 1, the width $W_1$ being equal to 600 nm, the width $W_2$ being equal to 200 nm, the height $H_1$ being equal to 500 nm and the height $H_2$ being equal to 200 nm.

5. The image sensor according to claim 3, wherein the color splitter structure is comprised or embedded in a host medium having a refractive index n, and wherein the color splitter structure deviates only the green color component from said incoming visible light towards one of said three pixels, with the refractive index $n_H$ being equal to 2.2, the refractive index $n_L$ being equal to 1.5, the refractive index n being equal to 1, the width $W_1$ being equal to 600 nm, the width $W_2$ being equal to 600 nm, the height $H_1$ being equal to 600 nm and the height $H_2$ being equal to 250 nm.

6. The image sensor according to claim 3, wherein the color splitter structure is comprised or embedded in a host medium having a refractive index n, and wherein the color splitter structure deviates only the red color component from said incoming visible light towards one of said three pixels, with the refractive index $n_H$ being equal to 1.8, the refractive index $n_L$ being equal to 1.6, the refractive index n being equal to 1, the width $W_1$ being equal to 600 nm, the width $W_2$ being equal to 600 nm, the height $H_1$ being equal to 900 nm and the height $H_2$ being equal to 200 nm.

7. The image sensor according to claim 1, wherein the refractive index $n_H$ is greater than the refractive index $n_L$.

8. An image sensing method for acquiring color information from incoming visible light using an image sensor comprising three pixels being partially covered by a color splitter structure, the method comprising deviating only one color channel of said incoming visible light towards one of said three pixels, and deviating other colors of said incoming visible light towards the other pixels among said three pixels, wherein the color splitter structure comprises a first, a second and a third parallelepiped structures arranged so that the first and the third parallelepiped structures are side by side and in contact with the second parallelepiped structure, and wherein the first and the third parallelepiped structures have same dimensions, and are made of a same dielectric material, with a refractive index $n_H$, and wherein said second parallelepiped structure being smaller in height compared to said first and third parallelepiped structures, and wherein said second parallelepiped structure being made of a dielectric material with a refractive index $n_L$.

9. The image sensing method according to claim 8, wherein the first, second and third parallelepiped structures have all base angles equal to 90°.

10. The image sensing method according to claim 8, wherein a height $H_1$ of the first and the third parallelepiped structures and a height $H_2$ of the second parallelepiped structure, verifies that the height $H_2$ being smaller than the height $H_1$, and wherein the first and the third parallelepiped structures have a same width $W_1$ and the second parallelepiped structure has a width $W_2$.

11. The image sensing method according to claim 10, wherein the color splitter structure is comprised or embedded in a host medium having a refractive index n, and wherein the color splitter structure deviates only the blue color component from said incoming visible light towards one of said three pixels, with the refractive index $n_H$ being equal to 2.2, the refractive index $n_L$ being equal to 1.5, the refractive index n being equal to 1, the width $W_1$ being equal to 600 nm, the width $W_2$ being equal to 200 nm, the height $H_1$ being equal to 500 nm and the height $H_2$ being equal to 200 nm.

12. The image sensing method according to claim 10, wherein the color splitter structure is comprised or embedded in a host medium having a refractive index n, and wherein the color splitter structure deviates only the green color component from said incoming visible light towards one of said three pixels, with the refractive index $n_H$ being equal to 2.2, the refractive index $n_L$ being equal to 1.5, the refractive index n being equal to 1, the width $W_1$ being equal to 600 nm, the width $W_2$ being equal to 600 nm, the height $H_1$ being equal to 600 nm and the height $H_2$ being equal to 250 nm.

13. The image sensing method according to claim 10, wherein the color splitter structure is comprised or embedded in a host medium having a refractive index n, and wherein the color splitter structure deviates only the red color component from said incoming visible light towards one of said three pixels, with the refractive index $n_H$ being equal to 1.8, the refractive index $n_L$ being equal to 1.6, the refractive index n being equal to 1, the width $W_1$ being equal to 600 nm, the width $W_2$ being equal to 600 nm, the height $H_1$ being equal to 900 nm and the height $H_2$ being equal to 200 nm.

14. The image sensing method according to claim 8, wherein the refractive index $n_H$ is greater than the refractive index $n_L$.

15. A color splitter comprising:
a first, a second and a third parallelepiped structure arranged so that the first and the third parallelepiped structures are arranged on opposite sides of the second parallelepiped structure and are in contact with the second parallelepiped structure;
wherein the first and the third parallelepiped structures have same dimensions and are made of a same dielectric material, and wherein the second parallelepiped structure is smaller in height compared to the first and third parallelepiped structures.

16. The color splitter of claim 15, wherein the first and the third parallelepiped structures have a refractive index $n_H$, the second parallelepiped structure has a refractive index $n_L$, and $n_H$ is greater than the refractive index $n_L$.

17. The color splitter structure of claim 16, wherein $n_H$ is between 1.8 and 2.2 and $n_L$ is between 1.5 and 1.6.

18. The color splitter of claim 15, wherein the first and the third parallelepiped structures have a width $W_1$ greater than a width $W_2$ of the second parallelepiped structure.

19. The color splitter of claim 18, wherein $W_2$ is between 200 nm and 600 nm.

20. The color splitter of claim 15, wherein the first and the third parallelepiped structures have a height $H_1$ between 500 nm and 900 nm and the second parallelepiped structure has a height $H_2$ between 200 nm and 250 nm.

* * * * *